United States Patent
Ang et al.

(10) Patent No.: US 6,384,675 B1
(45) Date of Patent: May 7, 2002

(54) DIFFERENCING NON-OVERLAPPED DUAL-OUTPUT AMPLIFIER CIRCUIT

(75) Inventors: Michael Anthony Ang, Santa Clara; Alexander Dougald Taylor, Cupertino, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/532,925

(22) Filed: Mar. 22, 2000

Related U.S. Application Data

(63) Continuation of application No. 08/884,187, filed on Jun. 27, 1997, now Pat. No. 6,198,325.

(51) Int. Cl.[7] .................................................. G06G 7/12
(52) U.S. Cl. ........................ 327/562; 327/112; 327/333; 330/264; 330/269; 330/277
(58) Field of Search ................... 327/560–563, 327/565, 566, 108, 112, 333; 330/251–253, 255, 262–265, 269, 277, 301

(56) References Cited

U.S. PATENT DOCUMENTS

| | | | |
|---|---|---|---|
| 3,986,134 A | * 10/1976 | Yokoyama | 330/269 |
| 4,434,396 A | 2/1984 | Montague | 323/230 |
| 4,471,482 A | 9/1984 | Meijer Cluwen | 327/100 |
| 5,095,261 A | 3/1992 | Schoofs | 323/222 |
| 5,450,356 A | 9/1995 | Miller | 365/189.05 |
| 5,513,059 A | 4/1996 | Atkins | 361/56 |
| 5,535,087 A | 7/1996 | Puckett et al. | 361/118 |
| 5,801,558 A | 9/1998 | Freyman et al. | 327/112 |

* cited by examiner

Primary Examiner—Timothy P. Callahan
Assistant Examiner—Minh Nguyen
(74) Attorney, Agent, or Firm—Gunnison, Mckay & Hodgson, L.L.P.; Forrest Gunnison

(57) ABSTRACT

An active digital voltage regulator circuit is a two terminal device that is connected in shunt to first and second power supply input lines. The active digital voltage regulator circuit stores energy during times when the local power supply voltage is greater than a predefined voltage, e.g., during times when the parasitic inductances supplement the local power supply voltage. The active digital voltage regulator circuit uses the stored energy to supplement the local power supply voltage during times when the local power supply voltage starts to collapse, e.g., during periods when inductive losses are preventing the power supply from maintaining the local power supply voltage. Consequently, digital active voltage regulator circuit smooths the local power supply voltage by greatly ameliorating the ripple voltages associated with parasitic inductances and resistances. A control circuit within the regulator circuit is a combination of two self-biasing and off-set nulling power supply monitor circuits. Each power supply monitor circuit further includes a differencing, non-overlapped, dual-output amplifier connected to the first and second power supply input lines. The differencing, non-overlapped, dual-output amplifier includes a predriver stage and an output stage, both of which are connected to the first and second power supply input lines. The structures and methods are useful on a power supply board to attenuate periodic ripple voltages produced by a DC-DC converter. In general, the structures and methods are applicable in any application with a period ripple voltage.

5 Claims, 13 Drawing Sheets

DIFFERENCING NON-OVERLAPPED DUAL-OUTPUT AMPLIFIER CIRCUIT

This application is a continuation of U.S. patent application Ser. No. 08/884,187 filed Jun. 27, 1997, which issued as U.S. Pat. No. 6,198,325 on Mar. 6, 2001.

BACKGROUND OF THE INVENTION

1. Field of the Invention

The present invention is related generally to local power supplies for integrated circuits with a high clock frequency, and in particular to circuits for use in limiting inductance-induced ripple voltage in integrated circuits with high dynamic power consumption.

2. Description of Related Art

Over the past few years clock speeds of central processing units (CPUs) have increased from a few MHz to 500 MHz or more. This increase in clock speed requires that components within the CPU, i.e., the CPU core, as well as components that communicate with the CPU operate at ever increasing clock speeds.

The increase in CPU clock speeds has been accompanied by an increase in the number of transistors on the CPU die, i.e., in the integration on the chip. The greater integration results in a larger die size, which in turn means that some circuits on the die are separated by greater distances, and in addition, more pins are required to take information to and from the die. Both of these effects complicate electromagnetic interference (EMI) shielding at the higher clock speeds.

FIG. 1 is a first order lumped model of a typical CPU configuration as seen by the power supply pins. A first inductor 145 represents the inductance of the board plane and via layer, and is connected to power supply line 110. Connected in series with inductor 145 is a second inductor 140 that represents the inductance of the socket and packaging of the CPU. Connected in series with inductors 140 and 145 is a series combination of a third inductor 137 and a resistor 135. The series combination of third inductor 137 and resistor 135 represents the inductance and resistance, respectively of either a ball grid array, or a lead frame with bond wires, and the power grid of CPU 100. The CPU die has an intrinsic RC characteristic that is represented by a series combination of resistor 151 and capacitor 152 connected to resistor 135 by local power supply line 110A and to ground line 111 by local power supply line 111A.

Typically, at the start of each clock cycle, many elements in CPU 100 change state, which in turn causes a momentary increase in current draw, i.e., the current draw changes as a function of time. The voltage generated by inductors 145, 140 and 137 is directly proportional to the changes in current with respect to time. Specifically, as the time derivative of the current increases, inductors 145, 140, 137 create a positive voltage drop which in turn reduces the voltage across local power supply lines 110A and 111A. Consequently, sufficient power cannot be provided instantaneously to the elements in the CPU core changing state, and so the voltage difference between local power supply lines 110A and 111A decreases, i.e., collapses.

However, once the various elements have switched state, the change in current draw with respect to time diminishes and the voltage difference recovers. In addition, inductors 145, 140, and 137 supplement the voltage across local power supply lines 110A and 111A because the time derivative of the current is negative.

These swings in voltages caused by the inherent inductances, including parasitic inductances, in response to changes in the current draw over time, are called inductance-induced ripple voltages or sometimes simply bounce. The inductance-induced ripple voltages have many undesirable features. For example, if the voltage collapse is too great, operation of CPU 100 can become unreliable. Also, the inductance-induced ripple voltages radiate from at least the pins of the circuit, and can radiate from power supply lines in CPU 100 that function as antennas. This requires additional shielding or other design changes to assure that CPU 100 complies with all relevant EMI standards. Additionally, if the frequency of the inductance-induced ripple voltage approaches the resonance frequency of the package, the voltage collapse and EMI noise is effectively amplified which in turn further exacerbates the problems associated with the parasitic inductances.

Various techniques have been used to minimize the effects of the inductance-induced ripple voltages in attempting to provide a stable power supply voltage across a CPU core. Specifically, power supply decoupling was normally achieved by placing banks of capacitors on the die between the local power supply lines carrying power supply and ground potentials so as to minimize the effects of parasitic inductances and resistances. However, each bank of capacitors has a limited band in the frequency spectrum where the bank is effective in smoothing out the inductance-induced ripple voltage, and has a limited capacity to decouple.

Moreover, as both the power consumption and the clocking speeds increased, the switching current at local power nodes within the integrated circuit required a relatively large capacitance to offset the power losses associated with the parasitic board and package inductances near the resonance frequency of the package. This, in turn, meant that a larger number of high frequency capacitors were required.

However, as the high frequency circuits become more highly integrated, the real estate on the die available for capacitors diminished as the requirement for the number of capacitors increased due to the increased power consumption. This limitation forced consideration of alternative physical and manufacturing configurations to provide the required amount of passive capacitance.

A first approach was to connect passive capacitance 160 on the board between the CPU socket power supply connectors and ground, i.e., between the connection of inductors 145 and 140 and ground as illustrated in FIG. 2A. It should be understood that passive capacitance 160 includes parasitic inductance and resistance that are connected in series with passive capacitance 160. However, this approach was not completely successful because this configuration did not effectively offset the effects of inductors 140 and 137.

Consequently, some manufacturers use discrete capacitors that are placed on top or below the package. In this configuration, passive capacitance 165 is connected between inductors 140 and 137 and ground as illustrated in FIG. 2B. While this configuration is better than the configuration of FIG. 2A, passive capacitance 165 does not directly affect the voltage across local power supply lines 110A and 111A.

Hence, other manufacturers include a separate chip of low inductance capacitors in the package containing the high frequency die and attempt to connect capacitance 170 on the separate chip between local power supply line 110A and 111A as shown in FIG. 2C.

While the current manufacturing techniques and physical configurations may be adequate for current microprocessor clock speeds and power consumption, as the power consumption and clock speeds continue to increase other solutions will be required. Unfortunately, the next generation of high-speed circuits will draw even more power, because typically the power consumption is proportional to the clock speed. With the higher power consumption and the fast clock speeds, the changes in the time derivative of the current will be more extreme which in turn indicates problems associated with inductance-induced ripple voltages will be further exacerbated.

The solution to power supply inductance-induced ripple voltages appears to be limited to the use of passive capacitors. Other techniques for offsetting the effects of parasitic inductance and resistance are not of use considering the feature sizes of the next generation of integrated circuits. Consequently, the dynamic power consumption of future generations of circuits may be limited by the inability to effectively offset the effects of parasitic inductances and resistances on power supply voltages.

SUMMARY OF THE INVENTION

In accordance with the principles of this invention, an active digital voltage regulator circuit overcomes the problems with stabilizing on-board power supply voltages for a high-frequency integrated circuit where parasitic inductance and resistance affect local power supply voltages. The active digital voltage regulator circuit is a two terminal device that is connected in shunt to the first and second power supply input lines, that in turn are connected to a circuit block that draws power from first and second power supply input lines.

The active digital voltage regulator circuit stores energy during times when the local power supply voltage is greater than a predefined voltage, e.g., during times when the parasitic inductances supplement the local power supply voltage. The active digital voltage regulator circuit uses the stored energy to supplement the local power supply voltage during times when the local power supply voltage starts to collapse, e.g., during periods when inductive losses are preventing the power supply from maintaining the local power supply voltage. Consequently, the digital active voltage regulator circuit smoothes the local power supply voltage by greatly ameliorating the ripple voltages associated with parasitic inductances and resistances.

The reduction in local power supply voltage variations caused by parasitic inductances has many advantages. First, the problems associated with local power supply voltage collapse are eliminated, and so the clock speeds and the associated dynamic power consumption can be increased over those attainable with only passive capacitance. Second, since the local power supply voltage is more stable at the increased clock speeds, any EMI problems associated with parasitic inductance-induced ripple voltages are minimized which in turn reduces the requirements for EMI suppression. Further, the packaging problems introduced by the requirements for ever increasing numbers of passive capacitors is eliminated. In addition, with the digital active voltage regulator of this invention, die area constraints no longer make on-chip power supply voltage stabilization impossible.

Hence, according to the principles of the invention, in one embodiment, the active digital voltage regulator circuit connects a plurality of capacitive elements in parallel across the first and second power supply input lines to charge the plurality of capacitive elements when the inductance-induced ripple voltages raise a voltage on the first and second power supply lines. Conversely, the digital active voltage regulator circuit connects the plurality of capacitive elements in series across the first and second power supply input lines to discharge the plurality of capacitive elements onto the first and second power supply lines when the inductance-induced ripple voltages lower a voltage on the first and power supply lines.

In one embodiment, the digital active voltage regulator circuit has a first capacitive element with a first lead connected to the first power supply input line and a second lead. A second capacitive element has a first lead connected to the second power supply input line and a second lead.

A first switch element is connected to the second lead of the first capacitive element and to the second power supply input line. In one embodiment, the first switch element is a MOSFET of a first type. The first switch element has an open state, and a closed state.

A second switch element is connected to the second lead of the second capacitive element, and to the first power supply input line. In one embodiment, the second switch element is a MOSFET of a second type. The second switch element also has an open state, and a closed state.

A third switch element is connected to the second lead of the first capacitive element and to the second lead of the second capacitive element. In one embodiment, the third switch element is a CMOS transmission gate. The third switch element has an open state, and a closed state.

A control circuit within the digital active voltage regulator is connected to the three switches, and configures the three switches so that the operations described above are performed by the digital active voltage regulator circuit. The control circuit changes the state of each of the first, second, and third switch elements with a break-before-make characteristic.

The control circuit can be implemented as a reactive control circuit, a predictive control circuit, and a deterministic control circuit. The reactive control circuit generates a reference voltage and then monitors an instantaneous threshold voltage to determine when to change the state of the switches. With the reactive control circuit, changes in the instantaneous threshold voltage relative to the reference voltage determine when the configuration of the capacitors is changed from shunt to series.

The predictive control circuit monitors a reference voltage to determine when to change the state of the switches. With the predictive control circuit, changes in the reference voltage relative to instantaneous threshold voltage determine when the configuration of the capacitors is changed from shunt to series. The deterministic control circuit is similar to the predictive control circuit, except the reference voltage is changed at deterministic time intervals.

In one embodiment, the control circuit is a combination of two self-biasing and offset-nulling power supply monitor circuits. Each self-biasing and offset nulling power supply monitor circuit has only the two power supply input lines and two output lines. One of the output lines is connected to one of switches used to place the capacitors in shunt, and the other output line is connected to the transmission gate that is used to place the capacitors in series.

Each self-biasing and offset-nulling power supply monitor circuit includes a first power supply input line, a second power supply input line, a first power supply monitor output line, a second power supply monitor output line, and a feedback line connected to one of the first and second power supply monitor output lines. Hence, one of the power supply monitor circuits has the feedback line connected to the second power supply monitor output line, and the other of the power supply monitor circuits has the feedback line connected to the first power supply monitor output line.

Each power supply monitor circuit also includes a reference voltage generator connected to first and second power supply input lines. The reference voltage generator has an input line connected to the feedback line, and a reference voltage generator output line. The reference voltage generator generates a reference voltage on the reference voltage output line.

Each power supply monitor circuit further includes a differencing non-overlapped, dual-output amplifier connected to the first and second power supply input lines. This amplifier has an amplifier input line connected to the reference voltage generator output line; a first output terminal coupled to the first (third) power supply monitor output line; and a second output terminal coupled to the second (fourth) power supply monitor output line.

In a quiescent state, a first output signal on the first power supply monitor output line of the amplifier has a first level; and a second output signal on the second power supply monitor output line of the amplifier has a second level. The second signal level is offset from the first signal level. The first and second output signals swing to a first voltage level, but reach the first voltage level at different points in time so that the first and second output signals are offset and non-overlapping for a period of time during the swing.

In one embodiment, the reference voltage generator includes a feedback driver connected to the first and second power supply input lines. The feedback driver has an input terminal connected to the reference voltage generator input line; and a feedback driver output terminal coupled to the reference voltage generator output line.

A capacitive element in the reference voltage generator is connected to one of the first and second power supply input lines, and to the reference voltage generator output line. Thus, in the first power supply monitor circuit, the capacitive element is connected to the first power supply input line, and in the second power supply monitor circuit, the capacitive element is connected to the second power supply line.

In one embodiment, the output impedance of the feedback driver is such that the feedback driver output terminal is connected directly to the reference voltage generator output line. In another embodiment, the output impedance of the feedback driver is lower, and so the feedback driver output terminal is connected to the reference voltage generator output line by a resistive element.

The differencing, non-overlapped, dual-output amplifier includes a predriver stage and an output stage, both of which are connected to the first and second power supply input lines. The predriver stage has an input terminal connected to the amplifier input line. The number of output lines of the predriver stage depends on the implementation of the predriver stage. The output stage has a first output terminal connected to the first(third) power supply monitor output line, and a second output terminal connected to the second (fourth) power supply monitor output line.

In a first embodiment, the predriver stage is a quasi-cascode predriver. The quasi-cascode predriver includes a MOSFET of a first type having a first lead connected to the first power supply input line; a second lead; and a gate connected to the amplifier input line. This embodiment of the predriver stage also includes a MOSFET of a second type having a first lead connected to the second power supply input line; a second lead coupled to the second lead of the MOSFET of the first type; and a gate connected to the amplifier input line. The predriver output line is coupled to the second leads of the MOSFETS of the first and second types.

In a second embodiment, the predriver stage is a first embodiment of an offset dual-output driver. The first embodiment of the offset dual-output driver has a MOSFET of a first type having a first lead connected to the first power supply input line; a second lead; and a gate connected to the amplifier input line. The offset dual-output driver also includes a MOSFET of a second type having a first lead connected to the second power supply input line; a second lead coupled to the second lead of the MOSFET of the first type; and a gate connected to the amplifier input line.

The offset dual-output driver has a first voltage divider connected between the second leads of the MOSFETS of the first and second types, and a second voltage divider connected between the second leads of the MOSFETS of the first and second types. A first predriver output line is connected to a tap of the first voltage divider, and a second predriver output line is connected to a tap of the second voltage divider.

In the first embodiment of the power supply monitor circuit, the output stage is a quasi-class A push-pull driver that is an second embodiment of a offset dual-output driver. Alternatively, the output stage could be the first embodiment of the offset dual-output driver, described above.

The second embodiment of the offset dual-output driver includes a MOSFET of a first type having a first lead connected to the first power supply input line; a second lead; and a gate connected to a predriver output line. The offset dual-output driver also includes a MOSFET of a second type having a first lead connected to the second power supply input line; a second lead coupled to the second lead of the MOSFET of the first type; and a gate connected to the predriver output line. A variable resistance element of the driver has a first lead connected to the second lead of the MOSFET of the first type, and a second lead connected to the second lead of the MOSFET of the second type.

A first output line of offset dual-output driver is connected to the second lead of the MOSFET of the first type. The second output line of this driver is connected to the second lead of the MOSFET of the second type.

When the predriver stage is implemented as the first embodiment of the offset dual-output driver, the output stage includes a high beta inverter having a first input terminal connected to a first predriver stage output line; a second input terminal connected to a second predriver output line; and the first output terminal connected to the first power supply monitor output line. In addition, the output stage includes a low beta inverter having a first input terminal connected to the first predriver stage output line; a second input terminal connected to the second predriver output line; and the second output terminal connected to the second power supply monitor output line.

The self-biasing, offset-nulling power supply monitor of this invention can be used in a wide variety of applications that require comparison of a reference voltage with an instantaneous threshold voltage. Similarly, the differencing, non-overlapped, dual-output amplifier can be utilized in any application in which it is necessary to compare a first input signal on a first input line, with another signal derived from the voltage across the other two terminals of the amplifier. Both the amplifier, and the power supply monitor circuit have the advantages described above.

DETAILED DESCRIPTION

Figure 1:
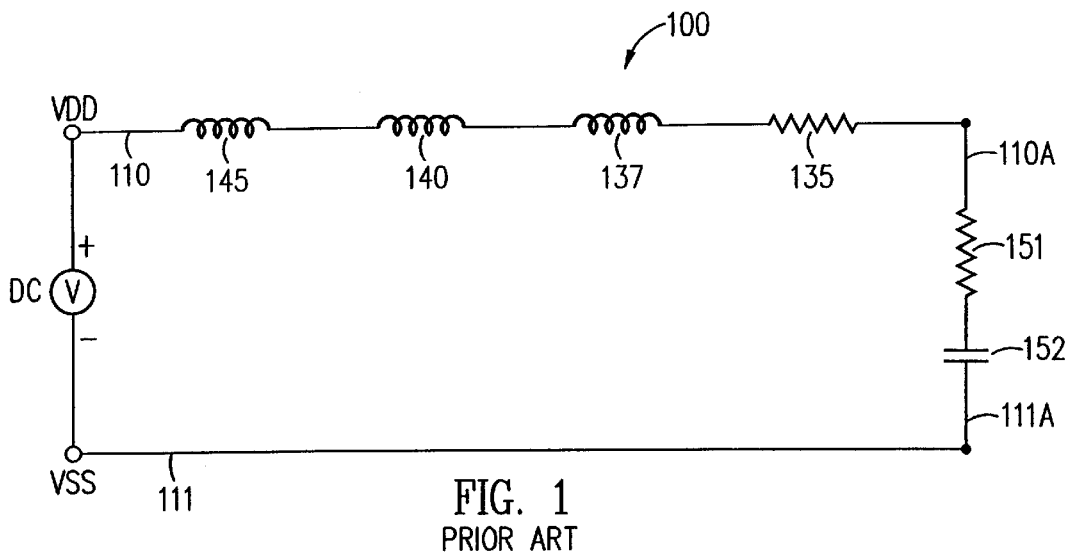
FIG. 1 is an illustration of a first-order parametric model of a prior art CPU as seen by the power supply pins of the CPU.
Figure 2A:
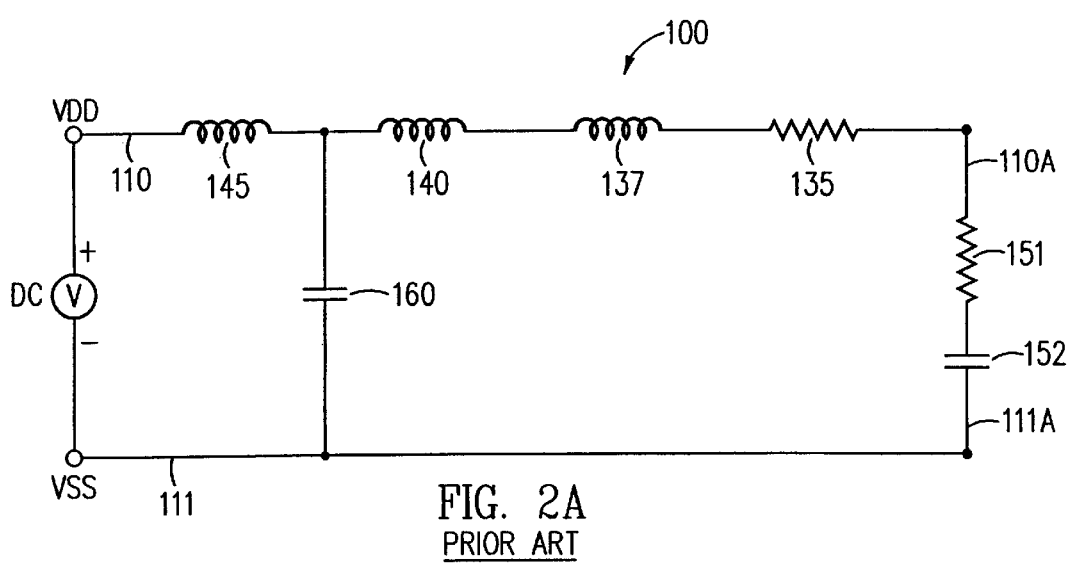
FIGS. 2A to 2C are illustrations of the model of FIG. 1 with a passive capacitor to suppress inductance-induced voltage variations in several alternative positions.
Figure 2B:
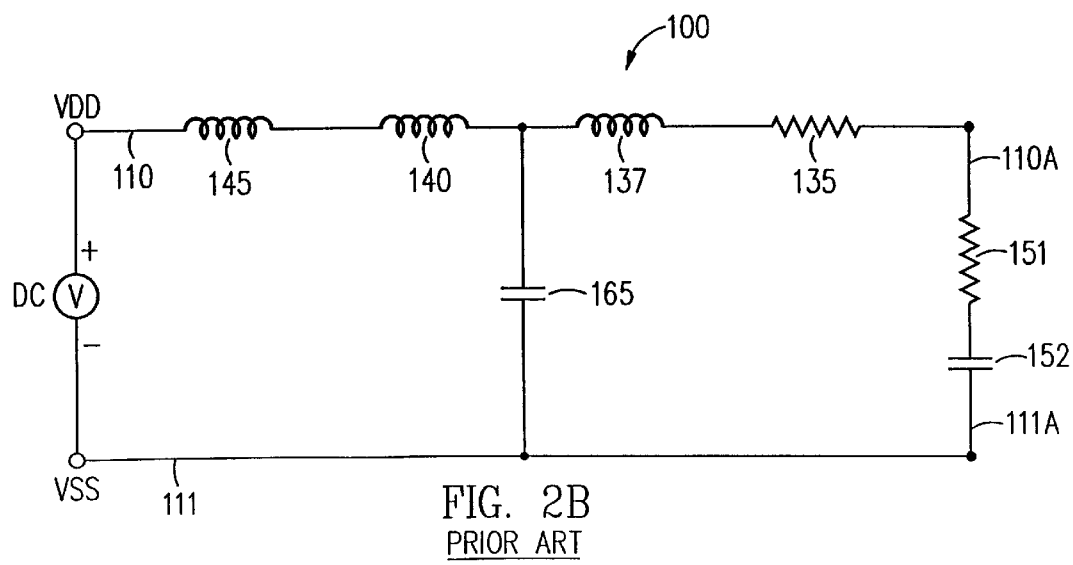
Figure 2C:
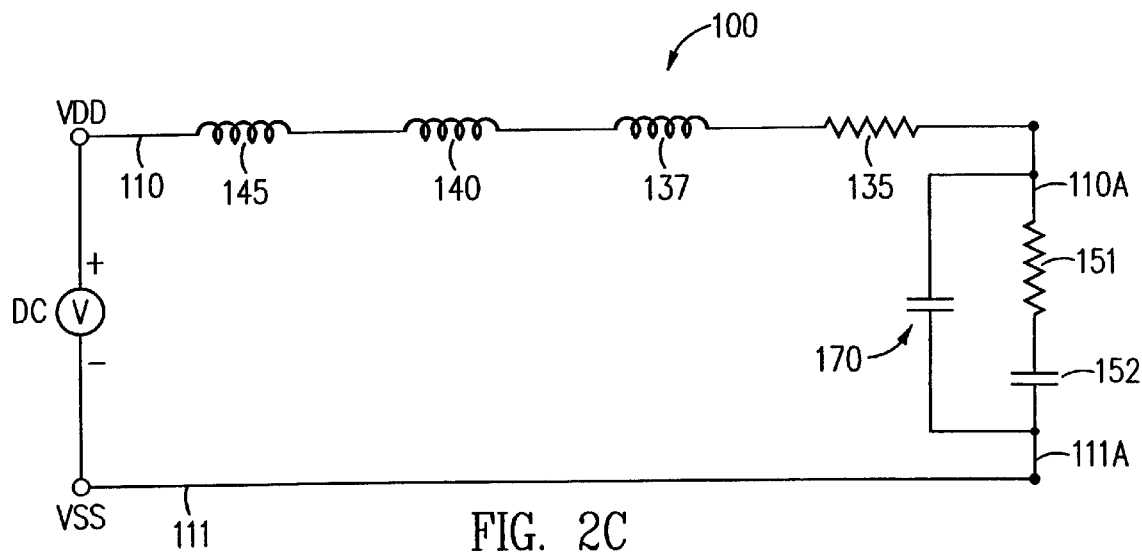
Figure 3A:
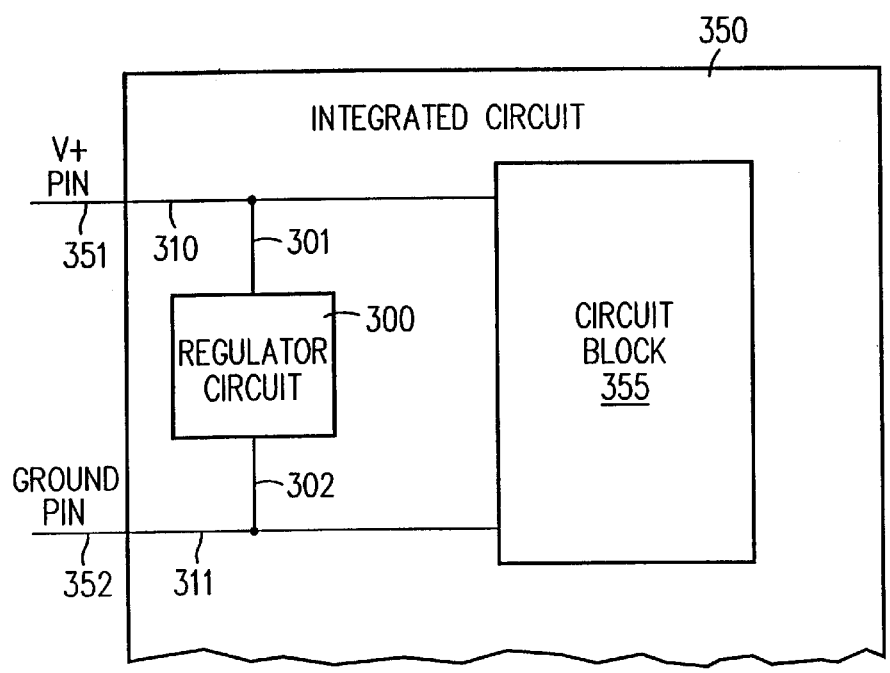
FIG. 3A is a block diagram of a voltage regulator circuit of this invention connected in shunt across local power supply lines in a high-frequency integrated circuit.

In accordance with the principles of this invention, an active digital voltage regulator circuit 300 (FIG. 3A) overcomes the problems with stabilizing on-board power supply voltages for a high-frequency integrated circuit 350 where parasitic inductance and resistance affect local power supply voltages. Use of active digital voltage regulator circuit 300 is not limited to use with CPU dies. Rather, active digital voltage regulator circuit 300 can be utilized with any circuit to eliminate undesirable inductance-induced ripple voltages, or the effects caused by undesirable inductance-induced ripple voltages such as increased electromagnetic interference.

Active digital voltage regulator circuit 300 stores energy during times when the local power supply voltage is greater than a predefined voltage, e.g., during times when the parasitic inductances supplement the local power supply voltage. Active digital voltage regulator circuit 300 uses the energy stored in the capacitors to supplement the local power supply voltage during times when the local power supply voltage starts to collapse, e.g., during periods when inductive losses are preventing the power supply from maintaining the local power supply voltage. Consequently, active voltage regulator circuit 300 smoothes the local power supply voltage by greatly ameliorating the ripple voltages associated with parasitic inductances and resistances.

The reduction in local power supply voltage variations caused by parasitic inductances has many advantages. First, the problems associated with local power supply voltage collapse are eliminated, and so the clock speeds and the associated power consumption can be increased over those attainable with only passive capacitance. Second, since the local power supply voltage is more stable at the increased clock speeds, any EMI problems associated with parasitic inductance-induced ripple voltages are minimized which in turn reduces the requirements for EMI suppression. Further, the packaging problems introduced by the requirements for ever increasing numbers of passive capacitors is eliminated. In addition, the die area constraints no longer make on-chip power supply voltage stabilization impossible.

Active digital voltage regulator circuit 300, as described more completely below, is a two terminal device that is connected across local power supply lines 310 and 311 (FIG. 3A) in a shunt configuration just as a passive capacitor would be connected across local power supply lines 310 and 311. Specifically, in this embodiment, a first input line 301 of circuit 300 is connected to a first local power supply line 310 that in turn is coupled to a first package pin 351, that typically is a drain supply voltage VDD pin, and is connected to a circuit block 355. A second input line 302 of circuit 300 is connected to a second local power supply line 311 that in turn is coupled to a second package pin 352, that typically is a source supply voltage VSS pin, and is connected to circuit block 355.

Figure 3B:
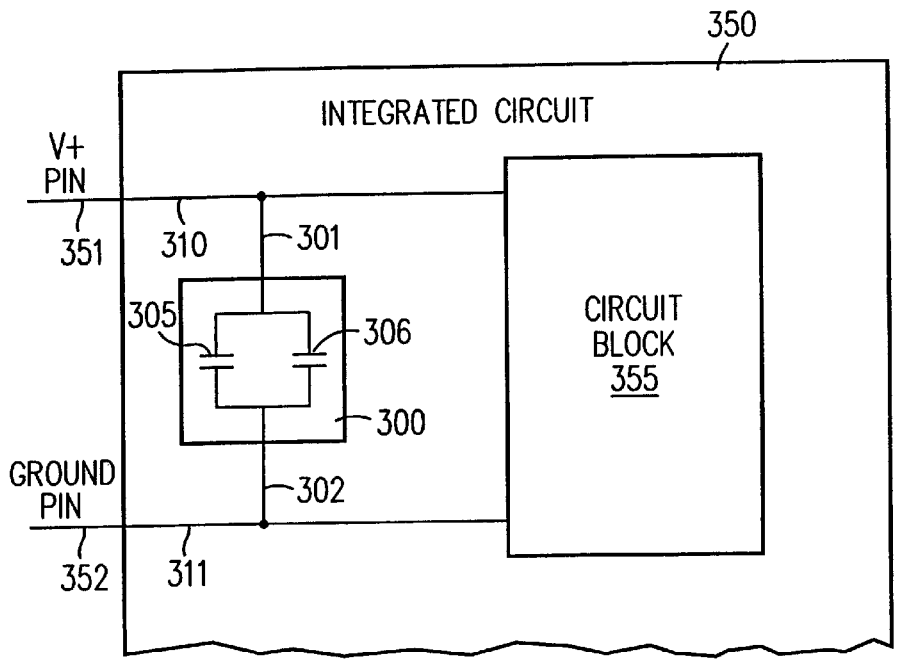
FIG. 3B is a block diagram of the voltage regulator circuit of this invention with the capacitors in the circuit connected in series, while previously connected in shunt, to discharge the capacitors when the voltage on the local power supply lines decreases due to inductance-induced ripple voltage.

Unlike a passive capacitor, active digital voltage regulator circuit 300 connects a pair of capacitors 305 and 306 (FIG. 3B) in series at times when the voltage across lines 310 and 311 drops, i.e., at times when the time derivative of the current increases and so parasitic inductance voltages losses increase. Capacitors 305 and 306 supply power to local power supply lines 310 and 311 in the series configuration. Thus, circuit 300 offsets the voltages losses associated with parasitic inductance.

Figure 3C:
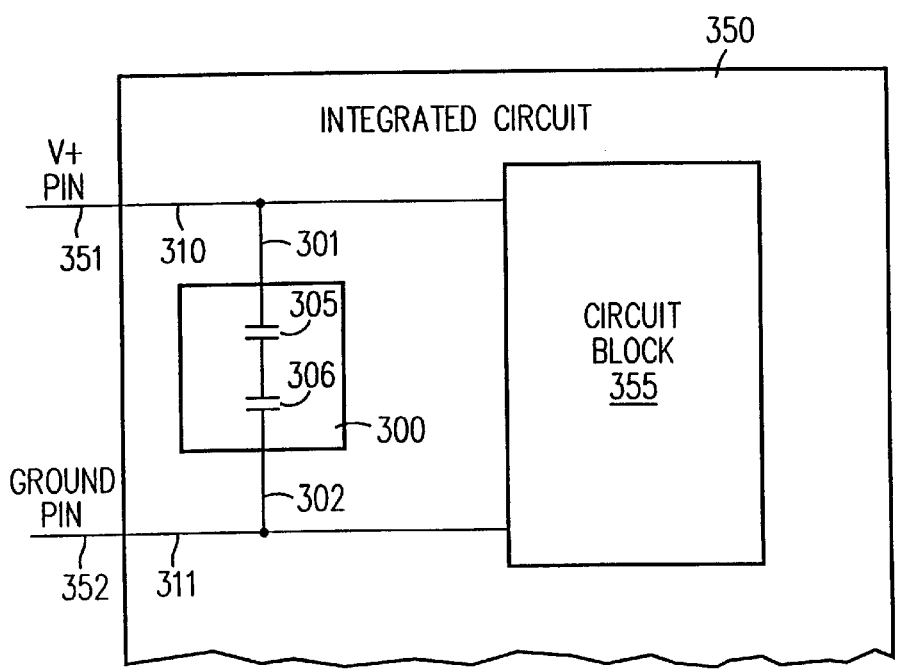
FIG. 3C is a block diagram of the voltage regulator circuit of this invention with the capacitors in the circuit connected in shunt, while previously connected in series, to charge the capacitors when the voltage on the local power supply lines increases due to inductance-induced voltage.

Conversely, active digital voltage regulator circuit 300 connects the pair of capacitors 305 and 306 (FIG. 3C) in shunt so that capacitors 305 and 306 are charged at times when the voltage across lines 310 and 311 increases, i.e., at times when the time derivative of the current is negative and so parasitic inductance voltages add to the voltage. Hence, active digital voltage regulator circuit 300 draws power from lines 310 and 311, stores the power in circuit 300, and supplies the stored power to lines 310 and 311 in a way that dampens the affects introduced by parasitic inductance-induced voltages.

Active digital voltage regulator circuit 300 dynamically switches between the series and shunt configuration, as described more completely below, in a time frame such that inductance-induced ripple voltages are minimized. In particular, in the event that some effect, such as package resonance, starts to amplify the parasitic inductance-induced voltages, regulator circuit 300 responds to the voltages on local power supply lines 310 and 311 so that the inductance-induced voltages are offset. Preferably, active digital voltage regulator circuit 300 compensates for inductance-induced changes in voltage across local power supply lines 310 within a high-frequency integrated circuit in a manner consistent with damping the largest source of bounce—package resonance.

In one embodiment, as described more completely below, active digital voltage regulator circuit 300 includes: pair of capacitors 305 and 306 (FIG. 4A), preferably of equal capacitance; a plurality of switch elements 410 to 412 that selectively couple and decouple capacitors 305 and 306 together, and to local power supply lines 310 and 311; and a control circuit 420 that configurations plurality of switch elements 410 to 412, sometimes referred to as switches 410 to 412, to minimize the inductance-induced ripple voltages on local power supply lines 310 and 311.

Specifically, control circuit 420 is connected to first switch element 410, second switch element 411, and third switch element 412. Control circuit 420 controls the open and closed states of each of first, second, and third switch elements 410 to 412. Control circuit 420 has a break-before-make characteristic. This means that control circuit 420 opens switch elements 410 and 412, before closing switch element 411, and conversely, that control circuit 420 opens switch element 411 before closing switch elements 410 and 412.

Figure 4B:
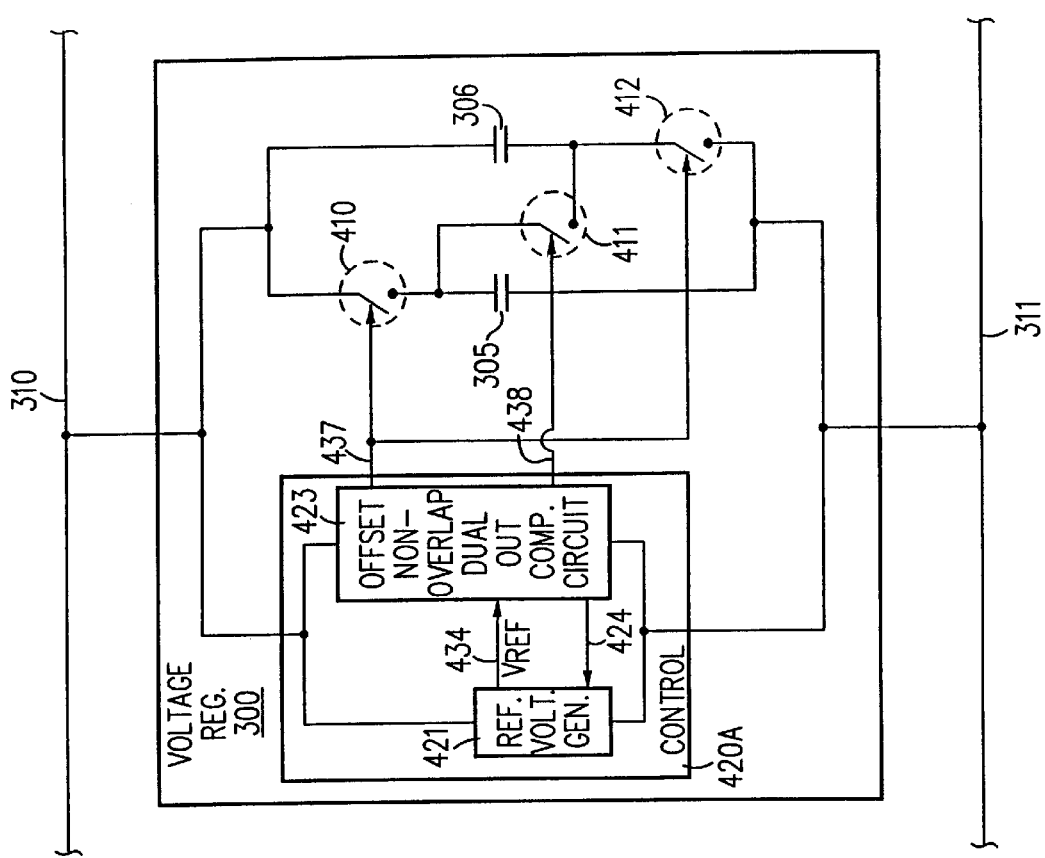
FIG. 4B is a more detailed block diagram of the voltage regulator circuit of this invention that illustrates a pair of capacitive elements, a plurality of switch elements that selectively couple and decouple the pair of capacitive element together and to local power supply lines, and a reactive control circuit that configurations the plurality of switch elements.
Figure 4A:
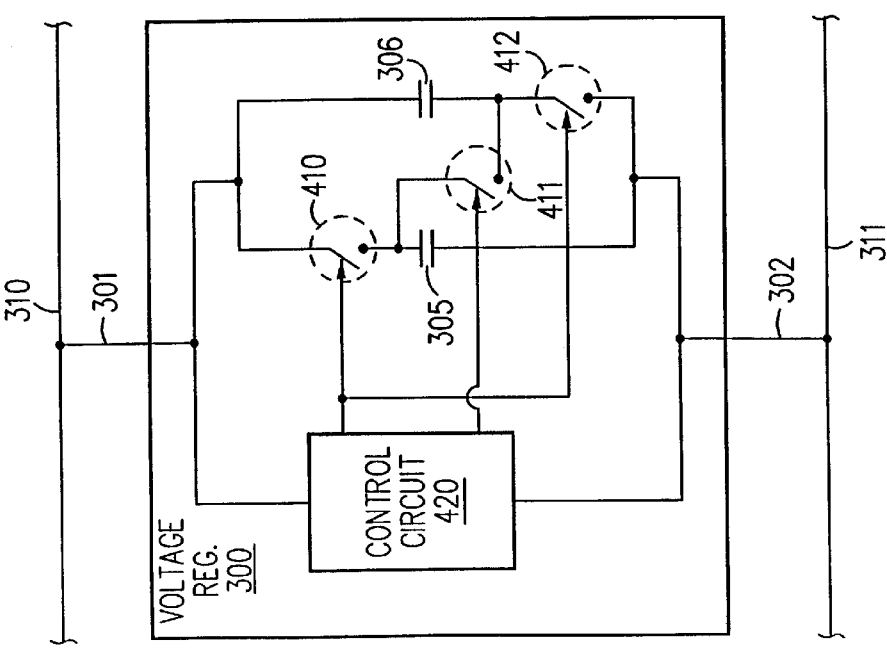
FIG. 4A is a more detailed block diagram of the voltage regulator circuit of this invention that illustrates a pair of capacitive elements, a plurality of switch elements that selectively couple and decouple the pair of capacitive element together and to local power supply lines, and a control circuit that configurations the plurality of switch elements.

According to the principles of this invention, control circuit 420 has three alternative embodiments, a reactive embodiment, a predictive embodiment, and a deterministic embodiment. In a first embodiment, control circuit 420 is a reactive control circuit 420A (FIG. 4B). In this embodiment, control circuit 420A includes a reference voltage generation circuit 421, and a differencing, non-overlapped, dual-output amplifier circuit 423. Control circuit 420A is self-biased and offset nulling.

Reference voltage generation circuit 421 is connected to local power supply lines 310 and 311. Reference voltage generation circuit 421 also receives a feedback signal on feedback line 424 from offset, non-overlapped, dual-output amplifier 423. The feedback signal on line 424 in combination with the voltage across local power supply lines 310 and 311 is used in defining reference voltage Vref on line 434 to differencing, non-overlapped, dual-output amplifier 423. Reference voltage Vref is representative of the voltage across local power supply lines 310 and 311 in a quiescent state. The feedback signal also assures a stable operating point for reference voltage generation circuit 421 and differencing non-overlapped, dual-output amplifier 423 in a quiescent state.

Differencing non-overlapped, dual-output amplifier 423 is connected between local power supply lines 310 and 311 and measures an instantaneous threshold voltage Vi that is determined by the voltage across lines 310 and 311. Differencing non-overlapped, dual-output amplifier 423 also receives reference voltage Vref as an input signal. As explained more completely below, amplifier 423 compares reference voltage Vref and instantaneous voltage threshold Vi, and generates appropriate control signals on dual-output lines 437 and 438.

Output line 437 is connected to switches 410 and 412, while output line 438 is connected to switch 411. The output signals on lines 437 and 438 are offset in time so that the switching of switches 410 and 412 is not overlapped with the switching of switch 411, and conversely.

As explained more completely below, in the quiescent state, i.e., when the current draw from local power supply lines 310 and 311 is approximately constant, control circuit 420A configures switch elements 410 and 412 in a mostly-closed state, and switch element 411 in a mostly-open state.

When circuit block 355 (FIG. 3A) starts to draw more current, the parasitic inductance and resistance cause instantaneous voltage threshold Vi across local power supply lines 310 and 311 to decrease. Thus, instantaneous voltage threshold Vi becomes less than input reference voltage Vref with respect to voltage VSS. When differencing non-overlapped, dual-output amplifier 423 detects this condition, amplifier 423 first opens switches 410 and 412, and then closes switch 411.

Thus, when instantaneous voltage threshold Vi is less than reference voltage Vref with respect to voltage VSS, capacitors 305 and 306 are connected in series across local power supply lines 310 and 311. Capacitors 305 and 306 are discharged and so increase the voltage across local power supply lines 310 and 311. Consequently, active digital voltage regulator circuit 300 is releasing energy at this time. This reduces the voltage drop and thereby reduces the inductance-induced ripple voltage that would normally be associated with the increased current draw by circuit block 355.

Conversely, when the derivative of the current drawn by circuit block 355 with respect to time starts to decrease, the parasitic inductance and resistance cause instantaneous voltage threshold Vi across local power supply lines 310 and 311 to increase. Thus, instantaneous voltage threshold Vi becomes greater than input reference voltage Vref with respect to voltage VSS. When differencing non-overlapped, dual-output amplifier 423 detects this condition, amplifier 423 first opens switches 411, and then closes switch 410 and 412.

Thus, when instantaneous voltage threshold Vi is greater than reference voltage Vref with respect to voltage VSS, capacitors 305 and 306 are connected in parallel across local power supply lines 310 and 311. Capacitors 305 and 306 are charged and so decrease the voltage across local power supply lines 310 and 311. Consequently, active digital voltage regulator circuit 300 is storing energy at this time. This reduces the voltage increase and thereby reduces the inductance-induced ripple voltage that would normally be associated with the decreased current draw by circuit block 355.

One important aspect of this invention is the break-before-make performance of switches 410 to 412. The break-before-make performance is required to prevent shorting of local power supply lines 310 and 311.

In a second embodiment, control circuit 420 is a predictive control circuit 420B that predicts the inductance-induced variations in the power supply voltage on lines 310 and 311. Accordingly, just before an inductance-induced voltage drop, control predictive circuit 420B first opens switches 410 and 412 and then closes switch 411. Hence, capacitors 305 and 306 are connected in series across local power supply lines 310 and 311, and offset any subsequent voltage drop associated with an increased current draw through parasitic inductances.

Conversely, just before energy stored in the parasitic inductances starts to raise the voltage on lines 310 and 311, predictive control circuit 420B opens switch 411 and then closes switches 410 and 412. Thus, when the voltage across local power supply lines 310 and 311 subsequently starts to increase, capacitors 305 and 306 are in shunt and are charged.

Figure 4D:
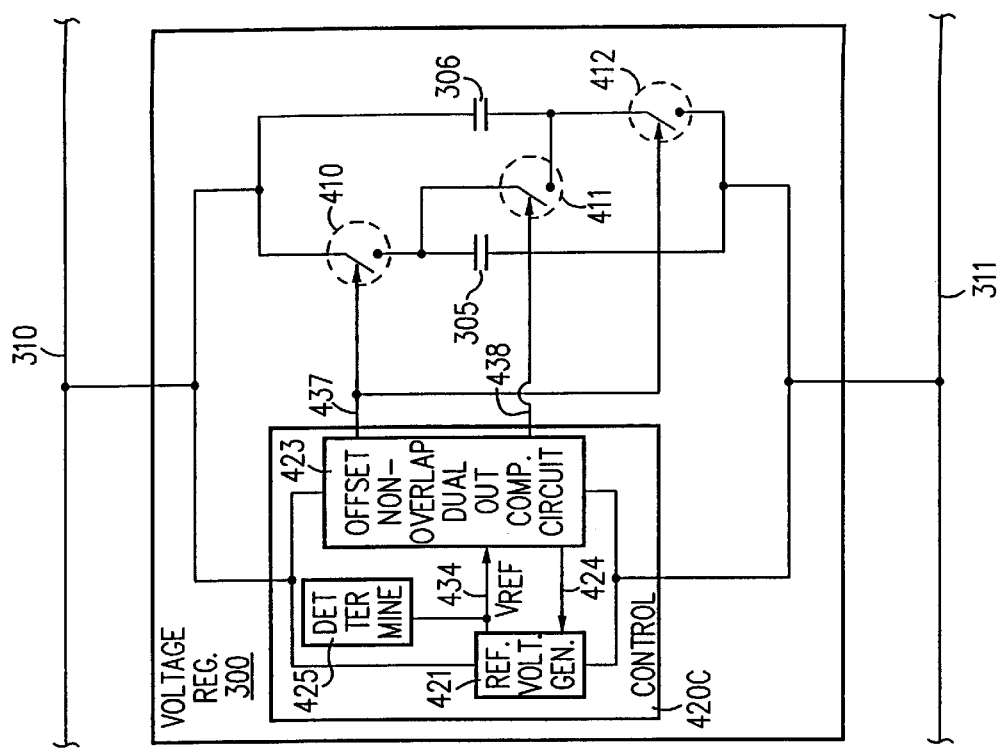
FIG. 4D is a more detailed block diagram of the voltage regulator circuit of this invention that illustrates a pair of capacitive elements, a plurality of switch elements that selectively couple and decouple the pair of capacitive element together and to local power supply lines, and a deterministic control circuit that configurations the plurality of switch elements.
Figure 4C:
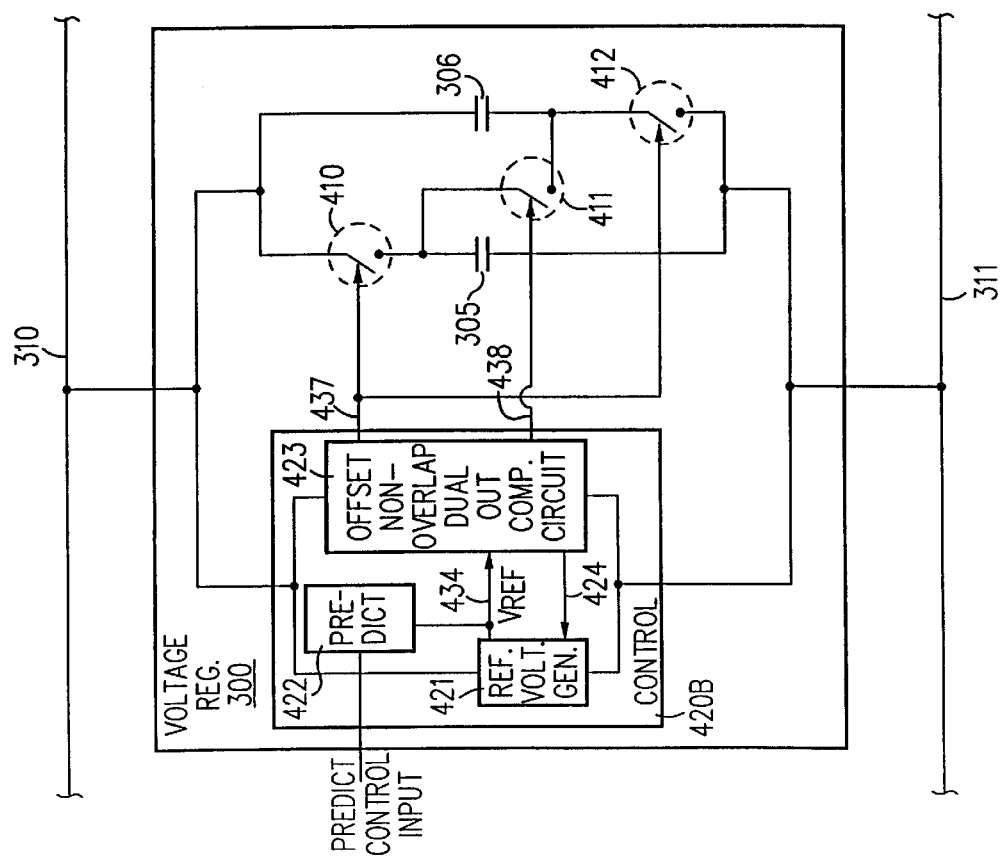
FIG. 4C is a more detailed block diagram of the voltage regulator circuit of this invention that illustrates a pair of capacitive elements, a plurality of switch elements that selectively couple and decouple the pair of capacitive element together and to power local supply lines, and a predictive control circuit that configurations the plurality of switch elements.

In the embodiment illustrated in FIG. 4C, circuits 421 and 423 of predictive control circuit 420B are the same as those described above, and that description is incorporated herein by reference. Circuits 421 and 423 are used in the quiescent state of predictive control circuit 420B. Predictive circuit 422 is also connected to line 434. Predictive circuit 422 selectively modifies the voltage on line 434 and thereby causes differencing non-overlapped, dual-output amplifier 423 to open and close switches 410 to 412 as described above. This is in contrast to reactive control circuit 420A where the input signal on line 434 is a reference voltage, and instantaneous voltage threshold Vi is the basis for changing the state of switches 410 to 412.

Predictive control circuit 420B is particularly advantageous in a CPU where it is known that certain software instructions cause an increased current draw. Prior to executing a software instruction that results in increased current draw, an instruction is executed that causes the CPU to send a signal to predictive circuit 422 and in response thereto, circuit 422 changes the voltage on line 434, i.e., pushes the voltage on line 434 high so that instantaneous voltage threshold Vi is less than the voltage on line 434. Consequently, differencing, non-overlapped, dual-output amplifier 423 configures switches 410 to 412 to place capacitors 305 and 306 in series so that upon execution of the instruction creating a high current draw and consequently a parasitic inductance voltage drop, the energy stored in capacitors 305 and 306 assists in maintaining the power supply voltage.

Conversely, just prior to completion of execution of the instruction creating a high current draw, the CPU sends another signal to predictive circuit 422. In response to this signal, predictive circuit 422 pulls the voltage on line 434 below instantaneous voltage threshold Vi. Again, note that voltage changes on line 434 and not changes in instantaneous voltage threshold Vi are controlling operation of amplifier 423. Consequently, circuit 423 configures switches 410 to 412 to place capacitors 305 and 306 in parallel so that upon completion of the instruction creating a high current draw, capacitors 305 and 306 are charged.

In this embodiment, in addition to the connections to local power supply lines 310 and 311, active digital voltage regulator circuit 300 has a predictive control input terminal. Also, notice that in the embodiment of FIG. 4C, if predictive circuit 422 is not active, and there should be an increased current draw, the reactive capability of the circuit would dampen any resulting inductance-induced ripple voltage.

In a third embodiment, control circuit 420 is a deterministic control circuit 420C (FIG. 4D). In this embodiment, the inductive voltage losses are associated with a particular edge in a clock cycle. Consequently, control circuit 420C opens switches 410 and 412 and closes switch 411 just before the clock edge, and then a predefined time after the clock edge opens switch 411 and closes switches 410 and 412.

In this embodiment, predictive circuit 422 in FIG. 4C is replaced by deterministic circuit 425 that functions similar to predictive circuit 422, except the voltage on line 434 is adjusted by deterministic circuit 425 at predefined time intervals.

Since the area required by active digital voltage regulator circuit 300 is relatively small, typically an order of magnitude smaller, compared to an equivalent bank of passive on-chip capacitors, a different active digital voltage regulator circuit 300 can be utilized for each circuit block within an integrated circuit. Alternatively, an active digital voltage regulator 300 circuit can be utilized only for those circuit blocks that are most adversely affected by inductance-induced ripple voltages, e.g., those circuit blocks with the largest derivative of current with respect to time. This is relevant because in an integrated circuit, local power supply line 310 (VDD) and local power supply line 311 (VSS) are localized by resistive and inductive isolation throughout the power supply grid/plane. Since active digital voltage regulator circuit 300 is relatively small, the circuit can be placed in white space, i.e., previously unused space, on the die.

Figure 5:
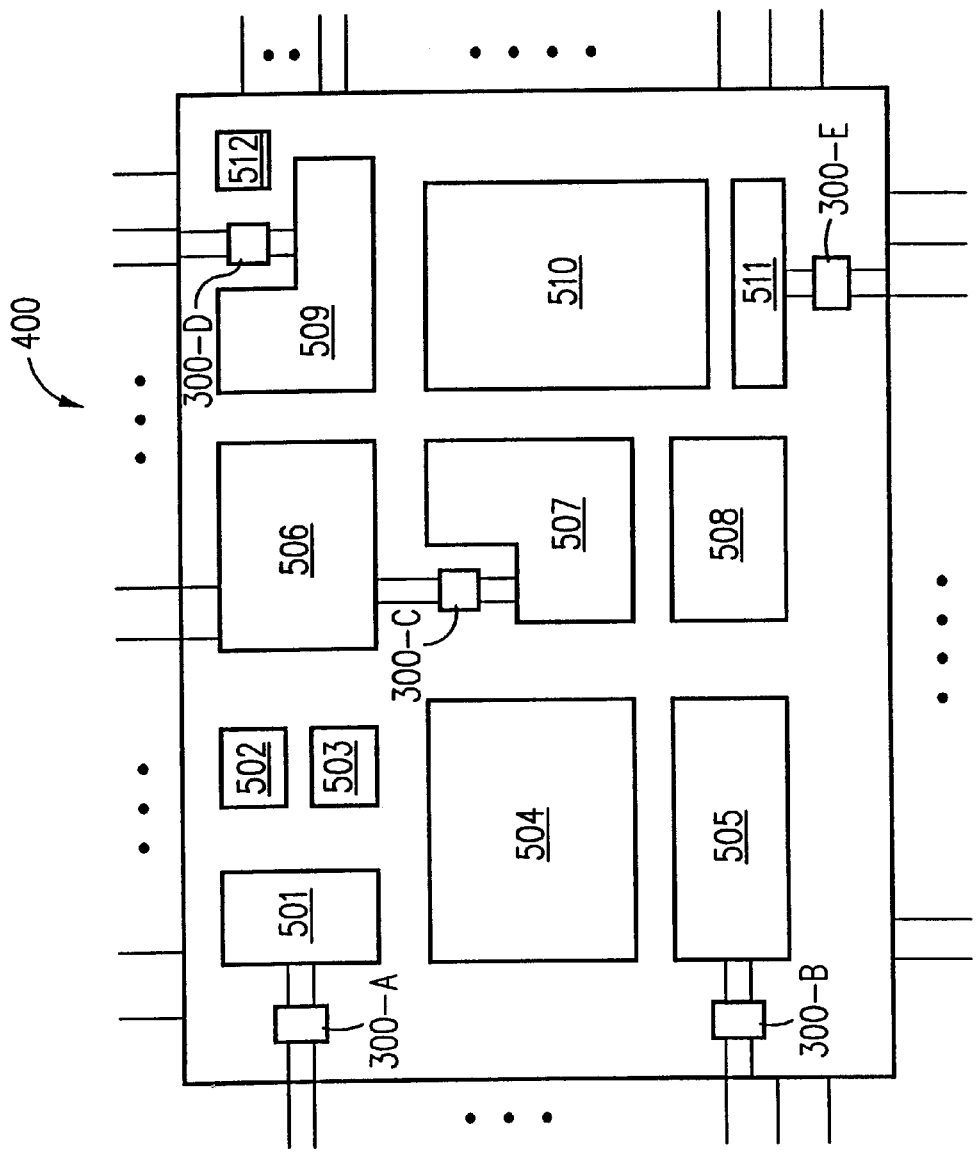
FIG. 5 is a block diagram that illustrates placement of a plurality of the active digital voltage regulator circuits of this invention on a high-frequency integrated circuit.

For example, in FIG. 5, integrated circuit 500 contains several circuit blocks 501 to 512. The particular functions performed by circuit blocks 501 to 512 and the interconnection of circuit blocks 501 to 512 are not of importance and so are not shown in FIG. 5. An important aspect is to identify the dynamic high power consumption circuit blocks, because these are the circuit blocks most likely to be affected by inductance-induced ripple voltages.

In this embodiment, circuit blocks 501, 505, 507, 509, and 511 each have an active digital voltage regulator circuit 300-A to 300-E, respectively, connected across local power supply lines to the circuit block. Hence, according to the principles of this invention, an active digital voltage regulator circuit 300 can be located at each local power supply node where inductance-induced ripple voltages are likely to be a problem. Consequently, since the inductance-induced ripple voltages may vary from local power supply node to local power supply node, the use of several active digital voltage regulator circuits permits compensating for the ripple voltage on a fairly localized basis rather than some global average effect across the entire chip.

Figure 6:
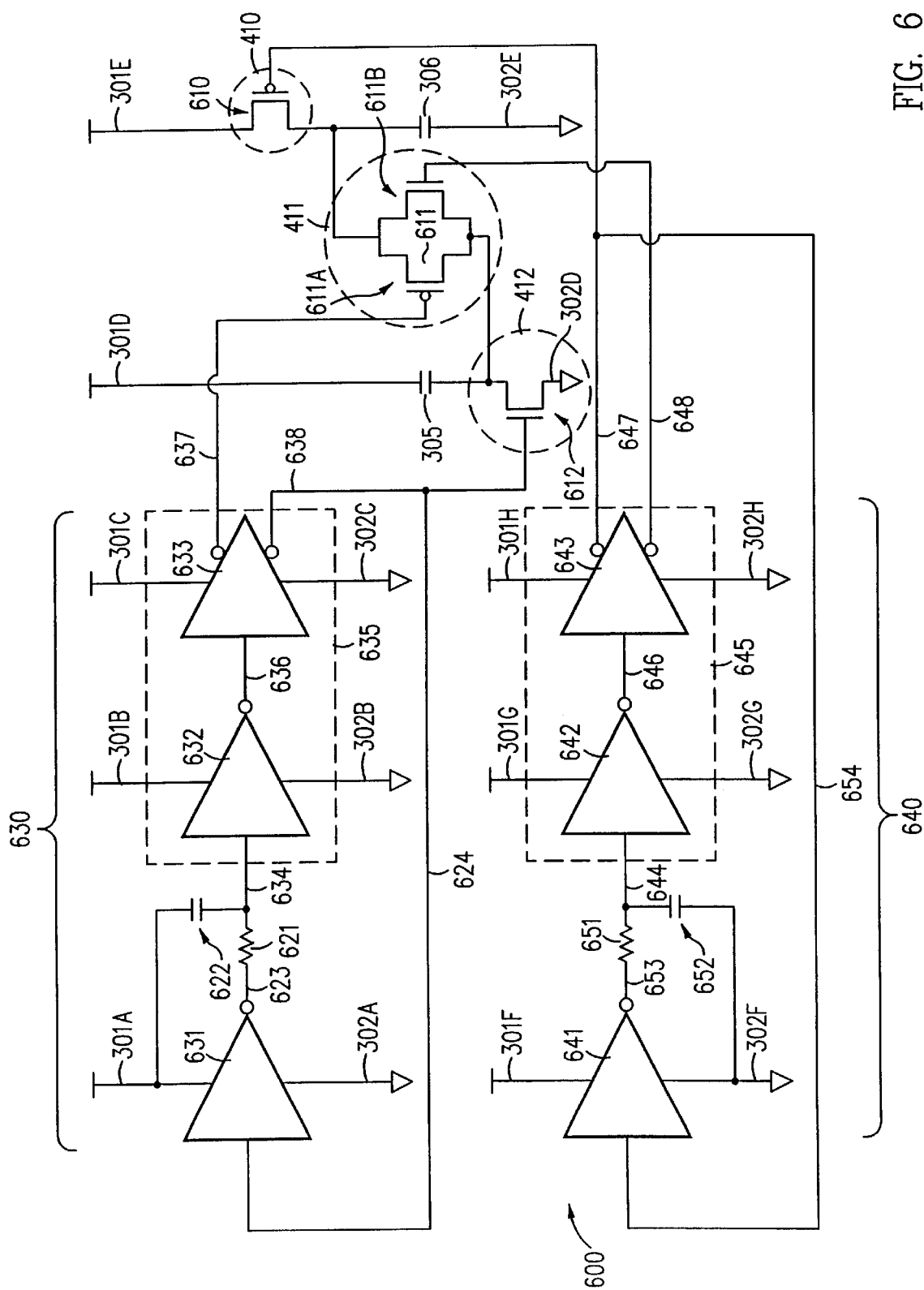
FIG. 6 is a high level schematic of a first embodiment of the active digital voltage regulator circuit of this invention.
Figure 11:
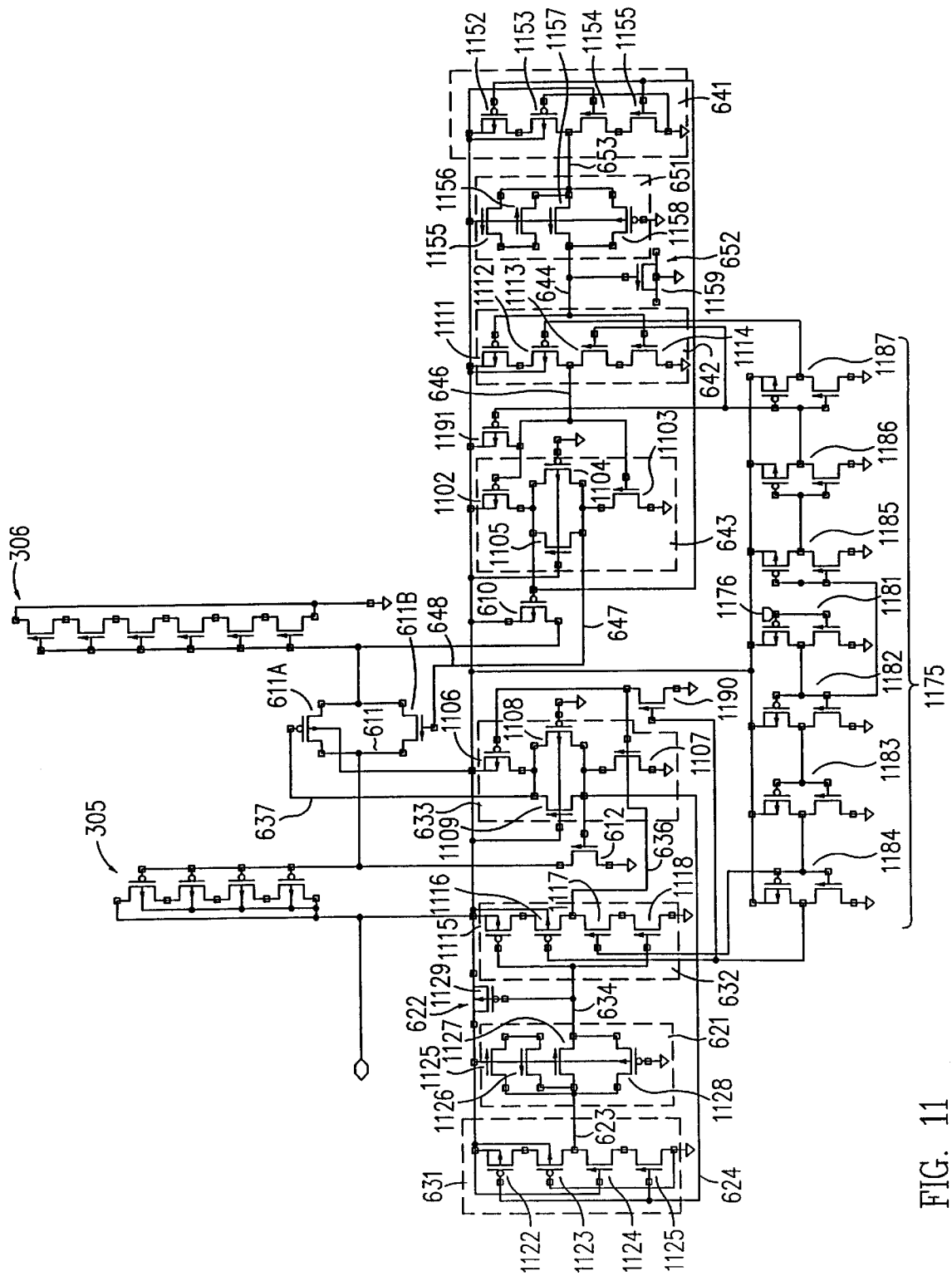
FIG. 11 is a detailed transistor level schematic of the active digital voltage regulator circuit of this invention illustrated in FIG. 6.

FIG. 6 is a diagram of one digital embodiment 600 of active digital voltage regulator circuit 300 as illustrated in FIG. 4B. FIG. 11 is a more detailed schematic diagram of one embodiment of active digital voltage regulator circuit 600. FIG. 11 is similar to FIG. 6, except the explicit CMOS field-effect transistors making-up the various elements in FIG. 6 are illustrated.

In this embodiment, reactive control circuit 420A (FIG. 4B) is two self-biasing, offset-nulling power supply monitor circuits 630 and 640 (FIG. 6) that together perform the functions described above for reactive control circuit 420A. Switch elements 410 and 412 are MOSFETs 610 and 612, respectively, and switch 411 is a CMOS transmission gate 611. Also, capacitors 305 and 306 are MOSFETS configured as capacitive elements.

Self-biasing, offset-nulling power supply monitor circuits 630 and 640 are self-biased and offset nulling. Therefore, circuits 630 and 640 are independent of layout mismatch, process, temperature, and power supply voltage variations. This is particularly advantageous because circuits 630 and 640 automatically compensate for any differences in the transistors making up the circuits.

Each of digital self-biasing, offset-nulling power supply monitor circuits 630 and 640 has a first plurality of input lines 301A to 301C, and 301F to 301H, respectively connected to local power supply line 310, and a second plurality of input lines 302A to 302C, and 302F to 302H, respectively, connected to local power supply line 311. Therefore, digital self-biasing, offset-nulling power supply monitor circuits 630 and 640 effectively have only two power supply input lines that are the only source of input signals to the circuits.

Each of differencing, non-overlapped, dual-output circuits 630 and 640 has dual output lines 637, 638 and 647, 648 respectively. In a quiescent state, as explained more completely below, a signal on one output line is at about reference voltage Vref and the signal on the other output line is offset from reference voltage Vref. The two output signals swing from the reference voltage to a logic zero and from the reference voltage to a logic one, i.e., swing from one rail to the other rail, as instantaneous voltage threshold Vi, that is affected by the voltage on local power supply lines 310 and 311, changes relative to reference voltage Vref. Since one quiescent output signal is closer to a rail voltage than the other quiescent output signal, the two output signals reach the rail voltage at different times. Specifically, there is a time delay introduced by the circuit between the times when the two output signals reach the rail voltage. Consequently, the operations of switches 410 and 412 are not overlapped with the operation of switch 411.

This configuration is advantageous for controlling the shunt-series configuration of capacitors 305 and 306, as described above, because the time delay in the output signals provides the required break-before-make performance. However, this configuration is advantageous for any application (a) that requires two output signals that reach the same signal level with an offset in time, and (b) that must respond to instantaneous voltage threshold Vi changes, in response to the voltage on the two input terminals, relative to reference voltage Vref.

Self-biasing, offset-nulling power supply monitor circuit 630 includes a differencing, non-overlapped, dual-output amplifier circuit 635 that is identical to a differencing, non-overlapped, dual-output amplifier circuit 645 in self-biasing, offset-nulling power supply monitor circuit 640. However, amplifier 635 responds to changes in instantaneous voltage threshold Vi in an equal but opposite phase as amplifier 645, i.e., one amplifier has a non-inverting output response, while the other has an equal but inverting output response. Amplifier circuits 635 and 645 perform the comparator function described above. In this embodiment, each of amplifiers 635 and 645 includes an offset dual-output stage 633 and 643, respectively, and a digital predriver stage 632 and 642, respectively.

Amplifier 635 is self-biased and offset nulling. The input signal of predriver stage 632 on input line 634 is a reference voltage, which in this embodiment is an average voltage VDDavg between local power supply line 310 and input line 634, i.e., a first predefined reference voltage with respect to voltage VDD. The way that this average voltage is set is described more completely below. Instantaneous voltage threshold Vi is determined by the voltage across input lines 301B and 302B.

For high gain-bandwidth, predriver stage 632 is a quasi-cascode predriver. As illustrated in more detail in FIG. 11, in one embodiment, predriver stage includes P-channel MOSFET(metal oxide silicon field effect transistor) 1115 and bias P-channel MOSFET 1116, that are connected in series between local power supply line 310 and output line 636, and bias N-channel MOSFET 1117 and N-channel MOSFET 1118, that are connected in series between local power supply line 311 and output line 636. Input line 634 is connected to gates G of MOSFETS 1115 and 1118. Herein, a P-channel MOSFET is an example of a first type of MOSFET, and an N-channel MOSFET is an example of a second type of MOSFET where the first type of MOSFET is complementary to the second type of MOSFET.

Figure 7A:
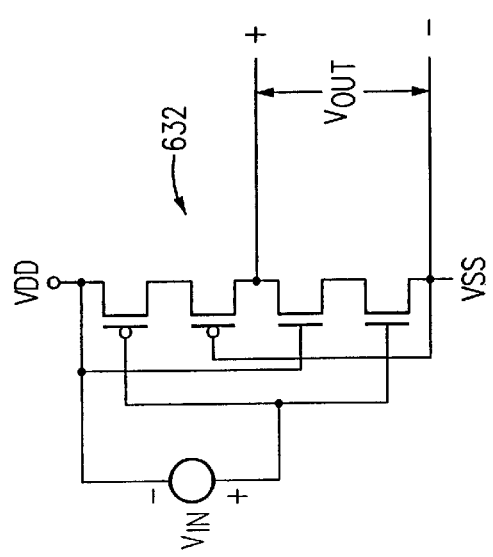
FIG. 7A is a schematic of one embodiment of a first predriver stage in a first differencing, non-overlapped, dual-output amplifier of this invention, and the definition of input voltage VIN and output voltage VOUT for the first predriver stage.

As explained more completely below, in the embodiment of FIG. 11, a kill circuit 1175 is included that, when activated, removes the functionality of active digital voltage regulator circuit 600. In the absence of kill circuit 1175, local power supply line 310 is connected to gate G of bias MOSFET 1117 and local power supply line 311 is connected to gate G of bias MOSFET 1116. FIG. 7A illustrates the configuration of predriver stage 632 without kill circuit 1175.

Figure 7B:
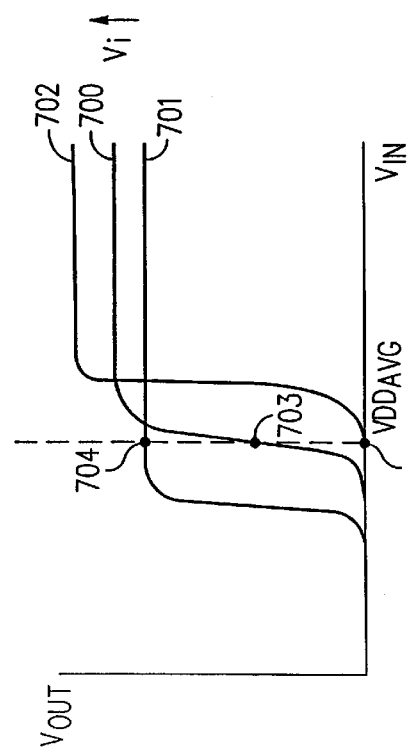
FIG. 7B is a plurality of traces of input voltage vs. output voltage of the first predriver stage of FIG. 7A for various instantaneous voltages.

Predriver stage 632 is quiescent when the voltage across local power supply lines 310 and 311 remains substantially constant, e.g., average voltage VDDavg on input line 634 and instantaneous voltage threshold Vi remain constant. FIG. 7A illustrates the definition of input voltage VIN and output voltage VOUT for predriver stage 632. FIG. 7B illustrates a plurality of traces 700 to 702 of an output signal of predriver stage 632 on output line 636 versus the input signal on input line 634 for different instantaneous voltage thresholds Vi.

Trace 700 is for the quiescent state. Trace 702 is for an increase in instantaneous voltage threshold Vi, while trace 701 is for a decrease in instantaneous voltage threshold Vi. When predriver 632 is quiescent, the output signal of predriver stage 632 is the signal level at point 703. If instantaneous voltage threshold Vi decreases and average voltage VDDavg with respect to voltage VDD remains constant, the output signal of predriver stage 632 goes active as represented by the signal level at point 704, and conversely goes inactive, as represented by the signal level at point 705, if instantaneous voltage threshold Vi increases and average voltage VDDavg with respect to voltage VDD remains constant. In each instance, the output signal from predriver stage 632 drives output stage 633.

The assertion that average voltage VDDavg with respect to voltage VDD is unchanged by a change in instantaneous voltage threshold Vi is a correct assertion. Capacitive element 622 has a large capacitance. Hence, resistive element 621 and capacitive element 622 have a RC time constant that is far greater than the time constant associated with changes in instantaneous voltage threshold Vi, i.e., the time period associated with the inductance-induced ripple voltage. Preferably, the RC time constant is at least an order of magnitude greater than the time period associated with the inductance-induced ripple voltage.

Figure 8A:
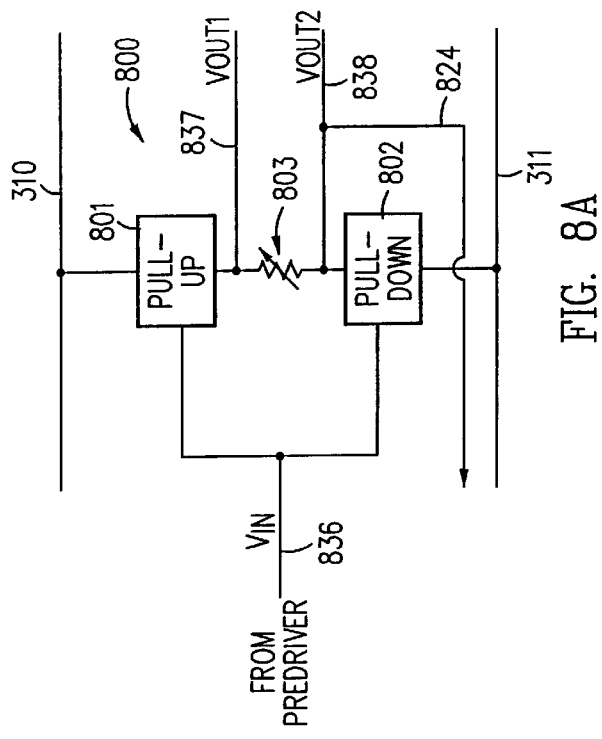
FIG. 8A is a diagram of one embodiment of an offset dual-output driver in the first differencing, non-overlapped, dual-output amplifier of this invention.

Output stage 633, in one embodiment, is a pseudo-class-A push pull driver 800 (FIG. 8A), this means that a pullup device 801 of driver 800, e.g., P-channel MOSFET 1106 (FIG. 11), and a pulldown device 802 of driver 800, e.g., N-channel MOSFET 1107 are coupled in series between local power supply lines 310 and 311 by a variable resistive element 803. Variable resistive element 803 has a maximum resistance at a midpoint of the swing range of the output signals of output stage 633, and a minimum resistance at both the minimum and maximum swings of the output signals.

In one embodiment, variable resistive element 803 is a transmission gate made-up of a parallel combination of N-channel MOSFET 1109 and P-Channel MOSFET 1108. Gate G of N-channel MOSFET 1109 is connected to local power supply line 310 and gate G of p-channel MOSFET 1108 is connected to local power supply line 311.

An input signal on input line 836 is provided to both pullup device 801 and pulldown device 802. A first output line 837 is connected to the connection of pullup device 801 and variable resistive element 803. A second output line 838 is connected to the connection of pulldown device 802 and variable resistive element 803.

At quiescence, the output signals' voltages on lines 837 and 838 are determined by which of the two output lines is used to provide a feedback signal that in turn is used to establish average voltage VDDavg. In general, the output line that provides the feedback signal is at the average voltage in the quiescent state. This configuration determines the state of switches 410 to 412 in the quiescent state.

Figure 8B:
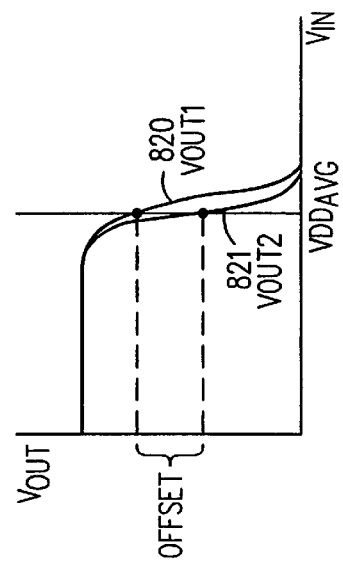
FIG. 8B is a diagram illustrating the dual offset output signals of the offset dual-output driver of FIG. 8A.

FIG. 8B illustrates traces 820 and 821 of output signals on lines 837 and 838, respectively, of driver 800 versus the input signal on line 836.

Variable resistance 803 is a maximum when the input signal is average voltage VDDavg with respect to voltage VDD. Herein, average voltage VDDavg is always with respect to voltage VDD, and so sometimes the relationship to voltage VDD is not explicitly stated.

In the quiescent state, output line 838 is at average voltage VDDavg, because output line 838 is connected to feedback line 824. Consequently, the signal on output line 837 is offset from average voltage VDDavg by the voltage drop across variable resistive element 803. As shown in FIG. 8B, when amplifier 635 is quiescent, the output signal on line 837 is greater than the output signal on line 838.

When instantaneous voltage threshold Vi decreases and the signal on input line 836 goes to voltage VDD, e.g., goes active, the output signal on 838 reaches voltage VSS at some time before the output signal on line 837 reaches voltage VSS. Hence, amplifier 635 has output signals that swing to the same voltage, but there is a time delay between the times when the two signals reach that voltage.

When instantaneous voltage threshold Vi increases and the signal on input line 836 goes to voltage VSS, e.g., goes inactive, the output signal on 838 reaches voltage VDD at some time after the output signal on line 837 reaches voltage VDD. Hence, again amplifier 635 has output signals that swing to the same voltage, but there is a time delay, an offset, between the times when the two signals reach that voltage.

As indicated above, differencing, non-overlapped, dual-output amplifier 645 also is self-biased and offset nulling. The input signal of predriver stage 642 on input line 644 is an average voltage VSSavg, i.e., a second predefined reference voltage with respect to voltage VSS, between local power supply line 311 and input line 644. The way that this average voltage is set is described more completely below. Instantaneous voltage threshold Vi determined by the voltage between input lines 301G and 302G.

For high gain-bandwidth, predriver stage 642 also is a quasi-cascode predriver. As illustrated in more detail in FIG. 11, in one embodiment, predriver stage includes P-channel MOSFET 1111 and bias P-channel MOSFET 1112, that are connected in series between power supply line 310 and output line 646, and bias N-channel MOSFET 1113 and N-channel MOSFET 1114, that are connected in series between power supply line 311 and output line 646. Input line 644 is connected to gates G of MOSFETS 1111 and 1114.

Figure 9A:
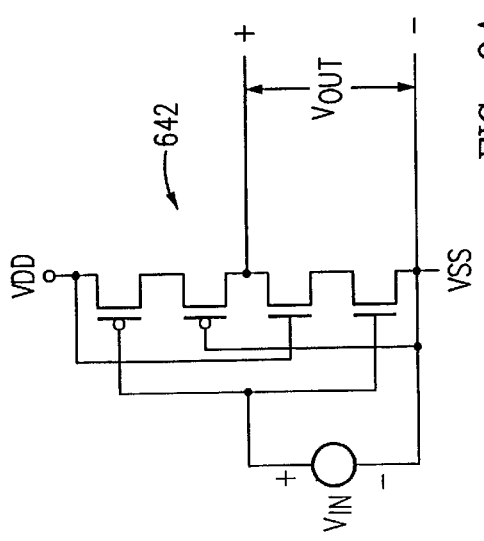
FIG. 9A is a schematic of one embodiment of a second predriver stage in a second differencing, non-overlapped, dual-output amplifier of this invention, and the definition of input voltage VIN and output voltage VOUT for the second predriver stage.

As indicated above, optional kill circuit 1175 is included in FIG. 11. In the absence of the kill circuit 1175, power supply line 310 is connected to gate G of bias MOSFET 1113 and power supply line 311 is connected to gate G of bias MOSFET 1112. FIG. 9A illustrates the configuration of predriver stage 642 without kill circuit 1175.

Figure 9B:
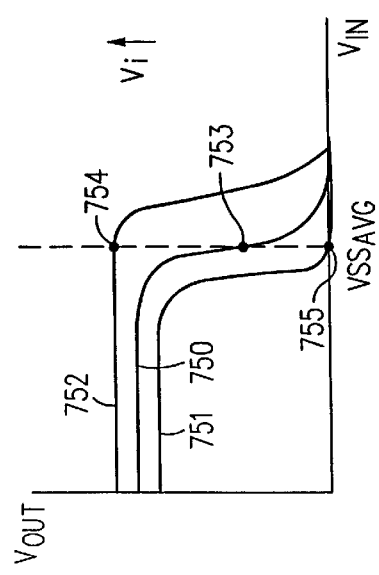
FIG. 9B is a plurality of traces of input voltage vs. output voltage of the second predriver stage of FIG. 9A for various instantaneous voltages.

Predriver stage 642 is quiescent when the voltage across power supplies lines 310 and 311 remains substantially constant, e.g., average voltage VSSavg on input line 644 and instantaneous voltage threshold Vi remain constant. FIG. 9A illustrates the definition of input voltage VIN and output voltage VOUT for predriver stage 642. FIG. 9B illustrates a plurality of traces 750 to 752 of an output signal of predriver stage 642 on output line 646 versus the input signal on input line 644 for different instantaneous voltage thresholds Vi.

Trace 750 is for the quiescent state. Trace 752 is for an increase in instantaneous voltage threshold Vi, while trace 751 is for a decrease in instantaneous voltage threshold Vi. When predriver 642 is quiescent, the output signal of predriver stage 642 is the signal level at point 753. If instantaneous voltage threshold Vi decreases and average voltage VSSavg with respect to voltage VSS remains constant, the output signal of predriver stage 642 goes inactive as represented by the signal level at point 754, and conversely goes active, as represented by the signal level at point 755, if instantaneous voltage threshold Vi increases and average voltage VSSavg with respect to voltage VSS remains constant. In each instance, the output signal from predriver stage 642 drives output stage 643.

The assertion that average voltage VSSavg with respect to voltage VSS is unchanged by a change in instantaneous voltage threshold Vi is a correct assertion. Capacitive element 652 has a capacitance equal to capacitive element 622 and so has a large capacitance. Similarly, resistive element 621 has the same resistance as resistive element 651, and so capacitive element 652 and resistive element 651 have the same RC time constant as that described above for resistive element 621 and capacitive element 622.

Figure 10A:
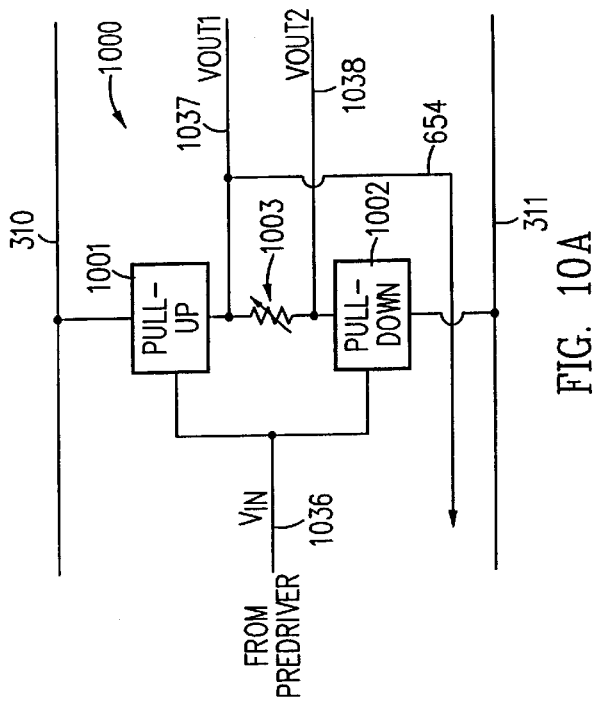
FIG. 10A is a diagram of one embodiment of an offset dual-output driver in the second differencing, non-overlapped, dual-output amplifier of this invention.

Output stage 643, in one embodiment, also is a pseudo-class-A push pull driver 1000 (FIG. 10A). The configuration of driver 1000 is identical to the configuration of driver 800 (FIG. 8A) except the feedback line 654 is connected to output line 1037, and the input signal on line 1036 is from predriver stage 642. Also, the first two digits of the reference numerals have been changed to maintain clarity in the subsequent description. Therefore, the description of the structure of driver 1000 is not repeated, and only the operation of driver 1000 is considered.

Figure 10B:
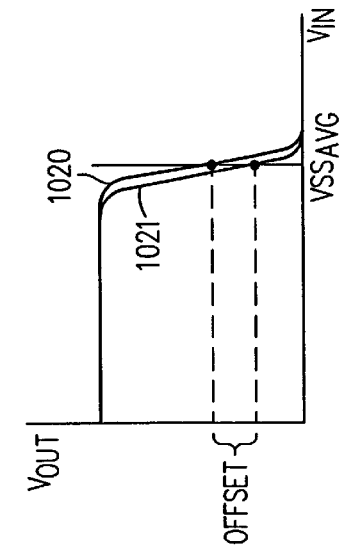
FIG. 10B is a diagram illustrating the dual offset output signals of the offset dual-output driver of FIG. 10A.

FIG. 10B illustrates traces 1020 and 1021 of output signals on lines 1037 and 1038, respectively of driver 1000 versus the input signal on line 1036. Variable resistance 1003 is a maximum when the input signal is average voltage VSSavg with respect to voltage VSS. Herein, average voltage VSSavg is always with respect to voltage VSS, and so sometimes the relationship to voltage VSS is not explicitly stated.

In the quiescent state, output line 1037 is at average voltage VSSavg, because output line 1037 is connected to feedback line 654. Consequently, the signal on output line 1038 is offset from average voltage VSSavg by the voltage drop across variable resistive element 1003. As shown in FIG. 10B, when amplifier 645 is quiescent, the output signal on line 1037 is greater than the signal on line 1038 and so the signal on line 1038 in turn is greater than voltage VSS.

When instantaneous voltage threshold Vi decreases and consequently the signal on input line 1036 goes to voltage VSS, e.g., goes inactive, the output signal on output line 1038 reaches voltage VDD at some time after the output signal on line 1037 reaches voltage VDD. Hence, amplifier 645 also has output signals that swing to the same voltage, but there is a time delay between the times when the two signals reach that voltage.

When instantaneous voltage threshold Vi increases and consequently the signal on input line 1036 goes to voltage VDD, e.g., goes active, the output signal on 1038 reaches voltage VSS at some time before the. output signal on line 1037 reaches voltage VSS. Hence, in this case, amplifier 645 again has output signals that swing to the same voltage, but there is a time delay between the times when the two signals reach that voltage.

Table 1 is a summary of the output signal levels of amplifiers 635 and 645 for changes in instantaneous voltage threshold Vi. The first and second within parentheses in Table 1 is used to indicate the time sequence of reaching the voltage.

TABLE 1

| Power Supply Voltage | Output line 837 | Output line 838 | Output line 1037 | Output line 1038 |
|---|---|---|---|---|
| Quiescent | VDD > Vout1 > VDDavg | VDDavg | VSSavg | VSSavg > Vout2 > VSS |
| Increase | VDD (1st) | VDD (2nd) | VSS (2nd) | VSS (1st) |
| Decrease | VSS (2nd) | VSS (1st) | VDD (1st) | VDD (2nd) |

First output line 837 (FIG. 8A) is output line 637 (FIG. 6) that carries one control signal to switch 411, which in this -embodiment is a transmission gate 611, that connects capacitors 305 and 306 in series. Specifically, output line 637 is connected to P-channel MOSFET 611A. Second output line 1038 (FIG. 10A) is output line 648 (FIG. 6) that carries another control signal to switch 411, i.e., to N-channel transistor 611B (FIGS. 6 and 11) in transmission gate 611.

Second output line 838 (FIG. 8A) is output line 638 (FIG. 6) that carries the control signal for switch 412, which in this embodiment is N-channel MOSFET 612. Specifically, second output line 638 is connected to a gate line that in turn is connected to a gate of N-channel MOSFET 612. First output line 1037 (FIG. 10A) is output line 678 (FIG. 6) that carries the control signal for switch 410, which in this embodiment is a P-channel MOSFET 610. Specifically, first output line 647 is connected to a gate line that in turn is connected to a gate of P-channel MOSFET 610.

In the quiescent state, MOSFET 612 has a voltage VDDavg on its gate, while MOSFET 610 has a voltage VSSavg on its gate (See Table 1). In this embodiment, voltage VDDavg is approximately equal to voltage VSSavg. Thus, MOSFETS 610 and 612 are mostly-on.

Conversely, MOSFET 611A has a voltage greater than voltage VDDavg on its gate, and MOSFET 611B has a voltage less than VSSavg on its gate. (See Table 1.) Thus, MOSFETS 611A and 611B are mostly-off in the quiescent state.

When instantaneous voltage threshold Vi increases from the quiescent state, MOSFETS 610 and 612 turn fully on, after MOSFETS 611A and 611B turn fully off. This result follows directly from the results summarized in Table 1.

When instantaneous voltage threshold Vi decreases from the quiescent state, MOSFETS 610 and 612 first turn fully off, and then MOSFETS 611A and 611B turn on. Again, this result follows directly from the results summarized in Table 1.

A primary loop through first self-biasing, offset-nulling power supply monitor circuit 630 is defined by the path from local power supply lines 310 and 311 through amplifier 635 to switches 411 and 412 and capacitors 305 and 306 back to local power supply lines 310 and 311. To assure that first self-biasing, offset-nulling power supply monitor circuit 630 has only a single operating point, the output signal on line 638 to switch 412, a MOSFET pulldown device, that controls charging of capacitor 305 is feedback on feedback line 624 to feedback driver 631 that determines average voltage VDDavg in conjunction with capacitive element 622.

A minor loop that includes feedback driver 631 is completed by connecting a resistive element 621 in series between an output terminal of feedback driver 631 and input line 634 of amplifier 635. Alternatively, feedback driver 631 could be designed to have an output impedance such that resistive element 621 is unnecessary.

The series combination of the output impedance of feedback driver 631 and resistive element 621 in combination with capacitive element 622 defines an RC time constant that is much higher than the time constant associated with the package resonant frequency. Also, capacitive element 622 must be large enough that the charge on capacitive element 622 is not affected by instantaneous voltage threshold charges. Feedback driver 631, in combination with resistive element 621 and capacitive element 622, defines average voltage VDDavg on input line 634 to amplifier 635. In one embodiment, average voltage VDDavg is set at about one-half of voltage VDD.

In this embodiment, feedback driver 631 includes P-channel MOSFETS 1122 and 1123, that are connected in series between local power supply line 310 and output line 623, and N-channel MOSFETS 1124 and 1125, that are connected in series between local power supply line 311 and output line 623. Feedback line 624 is connected to gates G of MOSFETS 1122 and 1125. Local power supply line 310 is connected to gate G of MOSFET 1124 and local power supply line 311 is connected to gate G of MOSFET 1124.

A primary loop through second self-biasing, offset-nulling power supply monitor circuit 640 is defined by the path from local power supply lines 310 and 311 through amplifier 645 to switches 411 and 410 and capacitors 305 and 306 back to local power supply lines 310 and 311. To assure that second differencing, non-overlapped, dual-output circuit 640 has only a single operating point, the output signal on line 647 to switch 410, a MOSFET pullup device, that controls charging of capacitor 306 is feedback on feedback line 654 to feedback driver 641 that determines average voltage VSSavg in conjunction with capacitive element 652.

A minor loop that includes feedback driver 641 is completed by connecting a resistive element 651 in series between an output terminal of feedback driver 641 and input line 644 of amplifier 645. Alternatively, feedback driver 641 could be designed with an output impedance such that resistive element 651 is unnecessary.

The series combination of the output impedance of feedback driver 641 and resistive element 651 in combination with capacitive element 652 defines an RC time constant that is much larger than the time constant associated with the package resonant frequency. Feedback driver 641 in combination with resistive element 651 and capacitive element 652 defines voltage VSSavg on input line 644 to amplifier 645.

In this embodiment, feedback driver 641 includes P-channel MOSFETS 1152 and 1153, that are connected in series between local power supply line 310 and output line 653, and N-channel MOSFETS 1154 and 1155, that are connected in series between local power supply line 311 and output line 653. Feedback line 654 is connected to gates G of MOSFETS 1152 and 1155. Local power supply line 310 is connected to gate G of MOSFET 1154 and local power supply line 311 is connected to gate G of MOSFET 1154.

In the embodiment of FIG. 11, resistive elements 621 and 651 are transmission gates made-up of a parallel combination of the series combination of N-channel MOSFETS 1125 to 1127 and P-channel MOSFET 1128, and a parallel combination of the series combination of N-channel MOSFETS 1155 to 1157 and P-Channel MOSFET 1158, respectively. Capacitive elements 622 is a P-channel MOSFET 1129 while capacitive element 652 is an N-channel MOSFET 1159.

In some applications, the ability to remove the control circuit and utilize capacitors 305 and 306 as passive capacitors may be desirable. Kill circuit 1175 has an input line 1176. When the signal on input line 1176 is inactive, kill circuit 1175 does not affect the operation of the control circuit. Conversely, when the signal on input line 1176 is active, kill circuit 1175 configures the control circuit so that capacitors 305 and 306 are connected in shunt irrespective of the changes in the voltage on local power supply lines 310 and 311.

Specifically, the input signal on line 1176 goes through four inverters 1181 to 1184 to increase the drive. The output signal of fourth inverter 1184 is connected to gate G of bias-P channel MOSFET 1116 in predriver stage 632. The output signal of third inverter 1183 is connected to gate G of bias-N channel MOSFET 1117 in predriver stage 632. The output signal of fourth invertor 1184 is also connected to a gate of an N-channel MOSFET 1190 that is connected between line 636 and local power supply line 311.

The output signal of first inverter 1181 drives the series combination of inverters 1185 to 1187. The output signal of inverted 1186 is connected to gate G of bias N-channel MOSFET 1113 in predriver circuit 642. The output signal of inverter 1187 is connected to gate G of bias P-channel MOSFET 1112 in predriver circuit 642. The output signal of inverter 1186 is also connected to a gate of a P-channel MOSFET 1191 that is connected between line 646 and local power supply line 310.

Figure 12:
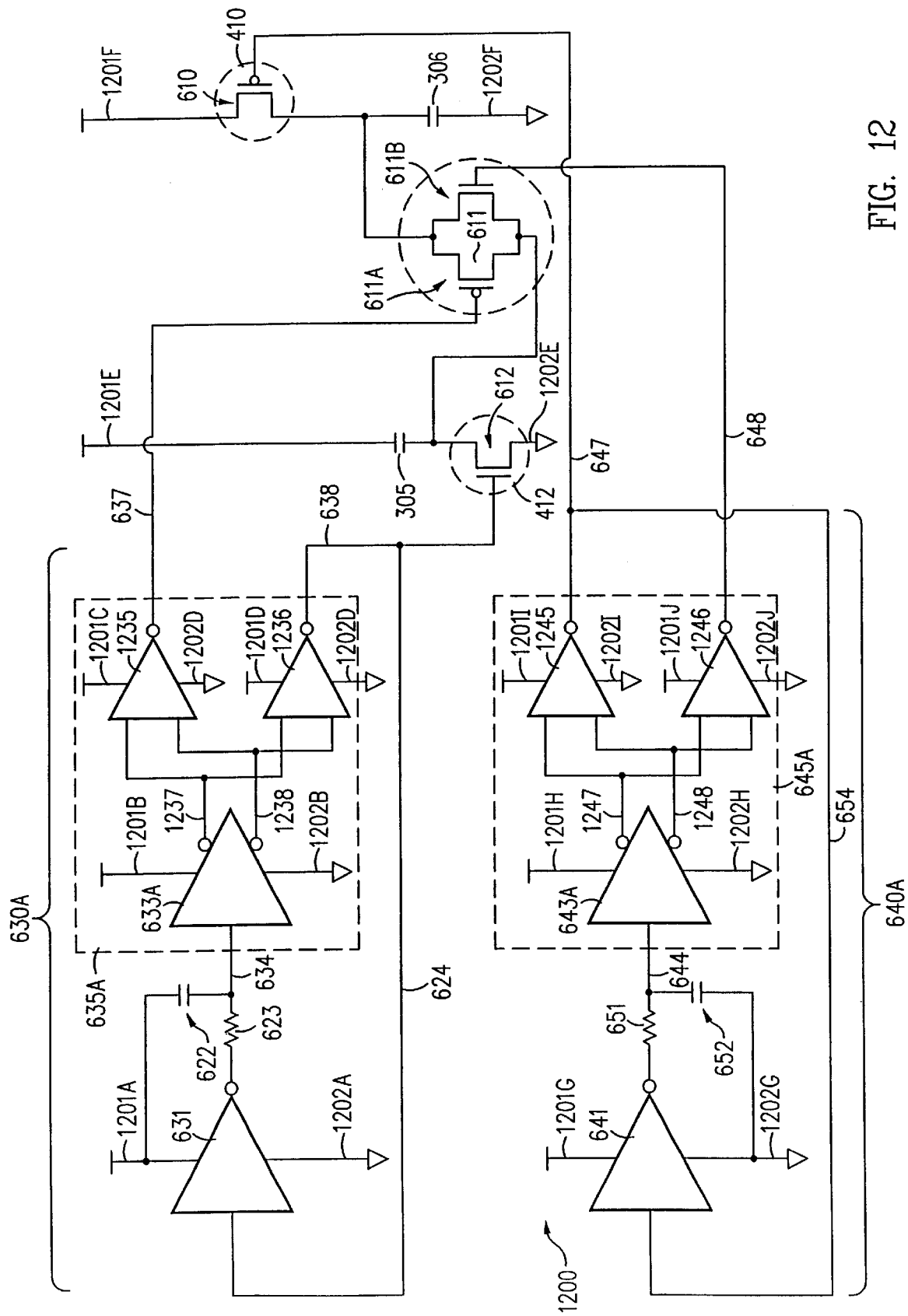
FIG. 12 is a high level schematic of a second embodiment of the active digital voltage regulator circuit of this invention.

The embodiment of FIG. 6 and FIG. 11 is advantageous in many applications. However, the time and voltage separation of the output signals of amplifiers 635 and 645, the speed performance of amplifiers 635 and 645, and the power consumption of amplifiers 635 and 645 is enhanced by control circuit 1200 (FIG. 12).

Figure 14:
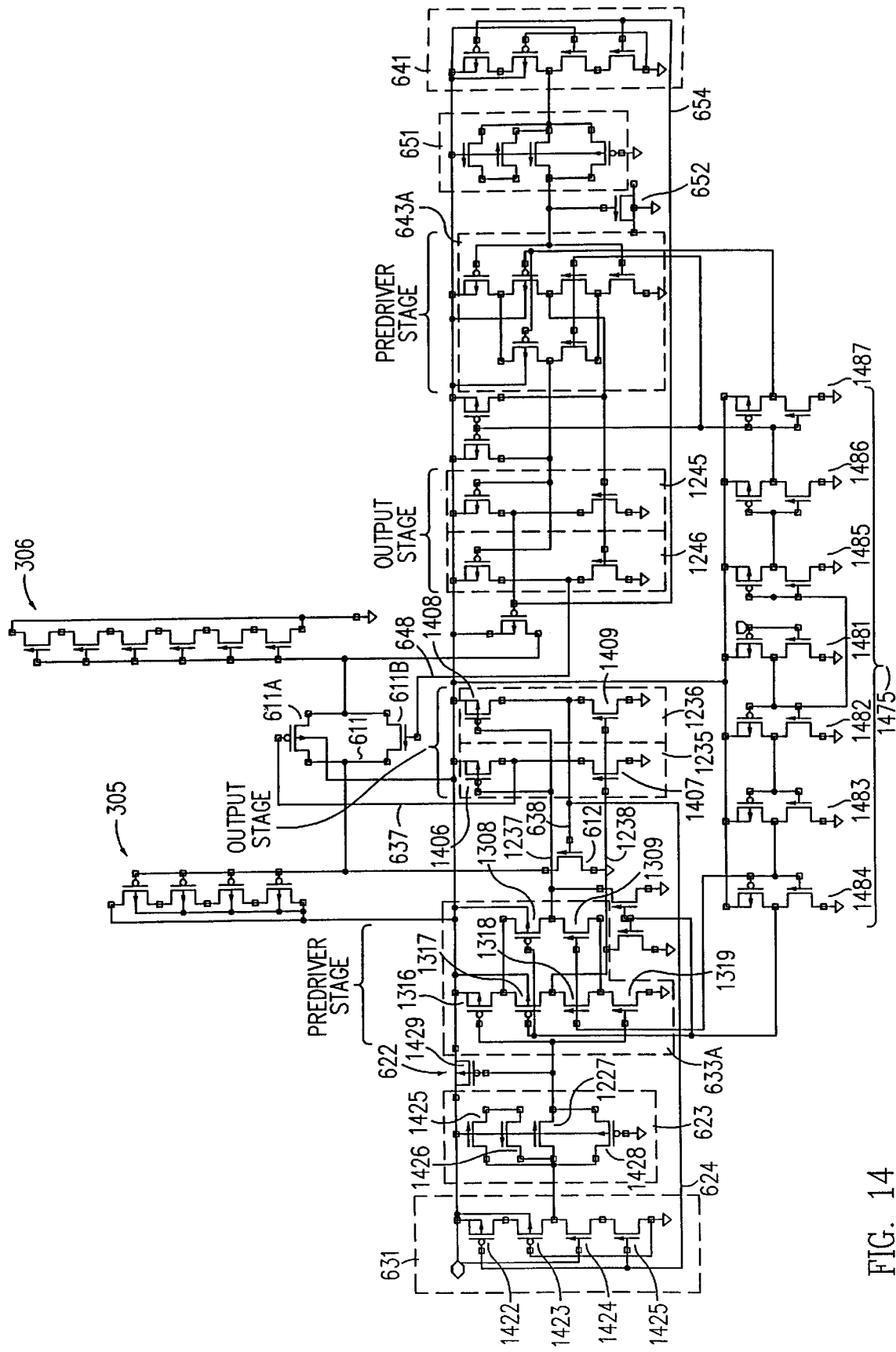
FIG. 14 is a detailed transistor level schematic of the active digital voltage regulator circuit of this invention illustrated in FIG. 12.

A more detailed schematic of one embodiment of control circuit 1200 is presented in FIG. 14. In FIGS. 12 and 14, objects with the same reference numerals as in the previous figures are the same objects. Objects with a reference number followed by a letter are similar to objects in the previous figures with the reference numeral, except the object is modified, as described more completely below.

Self-biasing, offset-nulling power supply monitor circuits 630A and 640A are self-biased and offset nulling. Circuits 630A and 640A are similar to circuits 630 and 640 described above, and have the same general operating characteristics, except differencing, non-overlapped, dual-output amplifiers 635A and 645A are modified in this embodiment to give improved speed, power, and switching performance. Amplifiers 635A and 645A have identical components. Therefore, only amplifier 635A is considered in further detail. In view of the above description, the differences in operation of amplifiers 635A and 645A, that are associated with the feedback signals and the resulting input signals, will be apparent to those of skill in the art.

In the embodiment of FIGS. 12, 13A, 13B, and 14 offset dual-output driver 633A functions as the predriver stage of amplifier 635A stage. Thus, input line 634 is connected to offset dual-output driver 633A. Offset dual-output driver 633A is connected to local power supply line 310 by input line 1201B, and to local power supply line 311 by input line 1202B. (The input line numbers have been changed from 301 to 1201 and from 302 to 1202 to avoid confusion.) A first output line 1237 of offset dual-output driver 633A is connected to a first input terminal of high beta inverter 1235 and to a first input terminal of low beta inverter 1236. A second output line 1238 of offset dual-output driver 633A is connected to a second input terminal of high beta inverter 1235 and to a second input terminal of low beta inverter 1236. Herein, a high beta inverter and low beta inverter are used to denote the relative transistor sizes of the two inverters. High beta inverter 1235 drives output line 637 while low beta inverter 1236 drives output line 638. In this embodiment, high beta inverter 1235 and low beta inverter 1236 comprise the output driver stage of amplifier 635A Offset dual-output driver 633A compares instantaneous voltage threshold Vi, that is determined by the voltage on input lines 1201B and 1202B, with average voltage VDDavg on input line 634, and switches from the quiescent state to one of the rail voltages in a manner similar to that described above for predriver 632. Thus, in this embodiment as a predriver, offset dual-output driver 633A compares instantaneous threshold voltage Vi with average voltage VDDavg with respect to voltage VDD. Changes in instantaneous threshold voltage Vi cause the two output signals of offset dual-output driver 633A to change from the quiescent state.

In addition, the output signals on lines 1237 and 1238 are offset in the quiescent state with the voltage on line 1238 being less than average voltage VDDavg and the voltage on line 1237 being greater than average voltage VDDavg. Hence, in this configuration the offset between the two output signals is increased over the earlier embodiment of the offset dual-output driver.

High beta inverter 1235 requires a larger input signal across the two input terminals to switch to voltage VSS than does low beta inverter 1236. Thus, in the quiescent state, the configuration of amplifiers 635A and 645A reduces the static power consumption of the output stage relative to the output stages in FIG. 6. This is because amplifiers 635A and 645A are pseudo-class-AB amplifiers.

Figure 13B:
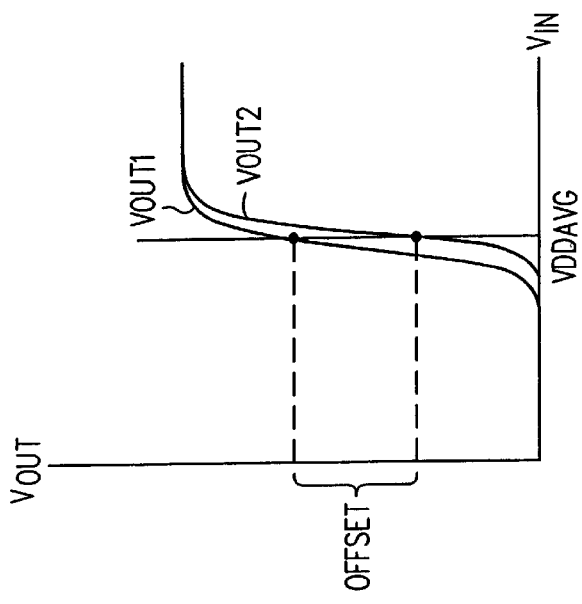
FIG. 13B is a diagram illustrating the dual offset output signals of the offset dual-output driver of FIG. 13A when the second output line drives a feedback signal.
Figure 13C:
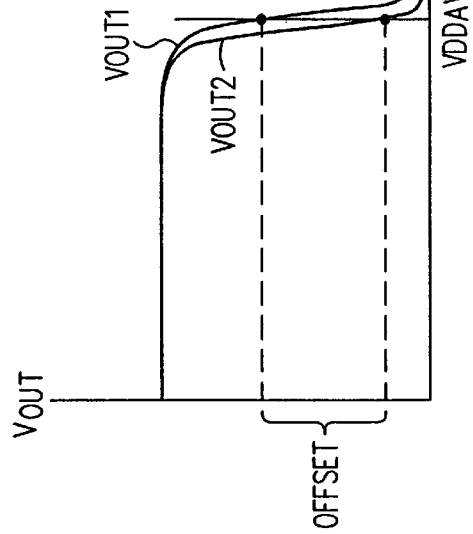
FIG. 13C is a diagram illustrating the dual offset output signals of the offset dual-output driver of FIG. 13A when the first output line drives a feedback signal.
Figure 13A:
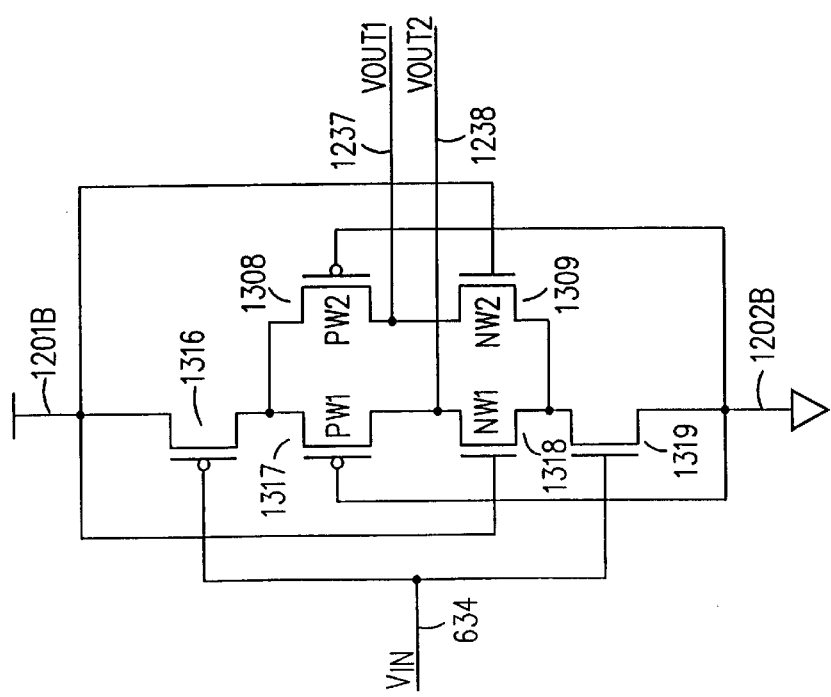
FIG. 13A is a diagram of one embodiment of an offset dual-output driver in a differencing, non-overlapped, dual-output amplifier in the embodiment of invention illustrated in FIG. 12.

To better understand the operation of offset dual-output output driver 633A, the embodiment of FIGS. 13A and 14 is considered in further detail. The embodiments of FIGS. 13A and 14 are equivalent, but the embodiment of FIG. 14 includes connections to kill circuit 1475 that is similar to kill circuit 1175 described above.

Offset dual-output driver 633A has a quasi-cascode driver and a pair of MOSFETS connected in parallel across bias MOSFETS 1317 and 1318. Specifically, driver 633A has a pair of P-channel MOSFETS, P-channel MOSFET 1316, and bias P-channel MOSFET 1317, connected in series between power supply input line 1201B and a second output line 1238. Driver 633A also has a pair of N-channel MOSFETS, N-channel MOSFET 1319 and bias N-channel MOSFET 1318, connected in series between power supply input line 1202B, and second output line 1238. Input line 634 is connected to gate G of P-channel MOSFET 1316 and to gate G of N-channel MOSFET 1319. Gate G of MOSFET 1317 is connected to power supply input line 1202B, and gate G of MOSFET 1318 is connected to power supply input line 1201B.

A P-channel MOSFET 1308 has a first lead connected to the connection of the leads of P-channel MOSFET 1316 and P-channel MOSFET 1317, and a second lead connected to a first lead of N-channel MOSFET 1309 and to a first output line 1237. N-channel MOSFET 1309 has a second lead connected to the connection of the leads of N-channel MOSFET 1318 and N-channel MOSFET 1319. Gate G of MOSFET 1308 is connected to power supply input line 1202B, and gate G of MOSFET 1307 is connected to power supply input line 1201B.

Effectively, offset dual-output driver 633A has two variable resistance voltage dividers connected in parallel between P-channel MOSFET 1316 and N-channel MOSFET 1319. The size of the resistive elements in each voltage divider is selected to provide the desired offset between the signals on output lines 1237 and 1238 in the quiescent state of driver 633A.

In this embodiment, since the resistive elements are MOSFETs, the size of the resistive elements is defined by ratio $\beta$ of the channel widths of the two MOSFETS connected in series. In this embodiment, the ratio of channel width PW1 of MOSFET 1317 to channel width NW1 of MOSFET 1318 is ratio $\beta 1$. The ratio of channel width PW2 of MOSFET 1308 to channel width NW2 of MOSFET 1309 is ratio $\beta 2$.

To provide an offset so that the voltage on line 1237 is greater than the voltage on line 1238, ratio $\beta 2$ is greater than ratio $\beta 1$. In one embodiment, ratio $\beta 2$ is about four times ratio $\beta 1$.

FIG. 13B is an illustration of the output signals on output lines 1237 and 1238 when the signal on output line 638 drives the feedback signal that is used in defining average voltage VDDavg with respect to voltage VDD. FIG. 13C is an illustration of the output signals on output lines 1237 and 1238 when the signal on output line 647 drives the feedback signal that is used to define average voltage VSSavg with respect to voltage VSS. This configuration has a greater offset between the quiescent output signals than that obtained with output driver stages 633 and 643 in FIG. 6.

In addition to selecting the channel widths for offset dual-output driver 633A, the channel widths of the transistors in high beta inverter 1235 and low beta inverter 1236 are selected to provide signal offset on lines 637 and 638 and to reduce power consumption in quiescence. In this embodiment, high beta inverter 1235 has a P-channel MOSFET 1406 (FIG. 14) and an N-channel MOSFET 1407 connected in series between local power supply lines 310 and 311. Gate G of P-channel MOSFET 1406 is connected to line 1237 and gate G of N-channel MOSFET 1407 is connected to line 1238. Output line 637 is connected to the lead of MOSFET 1406 that in turn is connected to a lead of MOSFET 1407.

Low beta inverter 1236 has a P-channel MOSFET 1408 and an N-channel MOSFET 1409 connected in series between local power supply lines 310 and 311. Gate G of P-channel MOSFET 1408 is connected to line 1237 and gate G of N-channel MOSFET 1409 is connected to line 1238. Output line 638 is connected to the lead of MOSFET 1408 that in turn is connected to a lead of MOSFET 1409.

The ratio of channel width PW3 of MOSFET 1406 to channel width NW3 of MOSFET 1407 is ratio $\beta 3$. The ratio of channel width PW4 of MOSFET 1408 to channel width NW4 of MOSFET 1409 is ratio $\beta 4$.

To provide the offset so that the voltage on line 637 is greater than the voltage on line 638 and reduce the static power consumption, ratio $\beta 4$ is greater than ratio $\beta 3$. In one embodiment, ratio $\beta 4$ is about two times ratio $\beta 3$.

Considering the similarity of the other structures in FIG. 14 to the corresponding structures in FIG. 11, the transistor level structures are not considered further herein.

The functionality of this invention can also be utilized in addressing EMI problems. As indicated above, inductance-induced ripple voltages are a source of electromagnetic interference. Consequently, the process of alternatively switching capacitors 305 and 306 from series to shunt across local power supply lines 310 and 311 eliminates electromagnetic interference by smoothing out the variations in the power supply voltage.

This application is related to the following commonly assigned and commonly filed applications:

1. U.S. patent application Ser. No. 08/884,184, entitled "A VOLTAGE REGULATOR CIRCUIT FOR ATTENUATING INDUCTANCE-INDUCED ON-CHIP SUPPLY VARIATIONS" of Michael Anthony Ang and Alexander Dougald Taylor filed on Jun. 27, 1997, now U.S. Pat. No. 6,028,417;
2. U.S. patent application Ser. No. 08/883,948, entitled "A VOLTAGE REGULATION METHOD FOR ATTENUATING INDUCTANCE-INDUCED ON-CHIP SUPPLY VARIATIONS" of Alexander Dougald Taylor and Michael Anthony Ang filed on Jun. 27, 1997, now U.S. Pat. No. 6,069,521; and
3. U.S. patent application Ser. No. 08/884,288, entitled "A SELF-BIASING, OFFSET NULLING POWER SUPPLY MONITOR CIRCUIT" of Michael Anthony Ang and Alexander Dougald Taylor filed on Jun. 27, 1997, now U.S. Pat. No. 5,973,547.

The embodiments of the invention described above are illustrative only of the principles of this invention and are not intended to limit the invention to the specific structures and elements described. For example, the principles of this invention can be used to attenuate ripple voltages that are produced by other than inductances. The structures and methods of this invention can be used on a power supply board to attenuate periodic ripple voltages produced by a DC-DC converter. In general, the structures and methods are applicable in any application with a period ripple voltage. In view of this disclosure, those of skill in the art will be able to implement the principles of this invention in a wide variety of applications and will be able to adapt the invention to the particular application.

We claim:

1. A digital offset, non-overlapped, dual-output amplifier circuit comprising:
a first power supply input line;
a second power supply input line;
an amplifier input line;
a predriver stage connected to said first and second power supply input lines, and having only a single predriver stage input line wherein said single predriver state input line is connected to said amplifier input line; and
an output stage coupled to said predriver stage to receive an output signal of said predriver stage, and having:
  a first output terminal of said output stage;
  a second output terminal of said output stage;
    wherein in a quiescent state, a first output signal on said first output terminal has a first level; and a second output signal on said second output terminal has a second level wherein said second level is offset from said first level;
    said first and second output signals swing to a third level different from said first and second levels, in response to said output signal of said predriver stage, but reach said third level at different points in time so that said first and second output signals are offset and non-overlapping for a period of time during said swing;
  said digital offset, non-overlapped, dual-output amplifier circuit is self-biasing and offset-nulling; and
  said predriver stage further comprises a quasi-cascode predriver, wherein said quasi-cascode predriver further comprises:
    a MOSFET of a first type having:
      a first lead connected to said first power supply input line;
      a second lead;
      a gate connected to said predriver stage input line;
    a MOSFET of a second type having:
      a first lead connected to said second power supply input line;
      a second lead coupled to said second lead of said MOSFET of said first type;
      a gate connected to said predriver stage input line; and
    a predriver output line coupled to said second leads of said MOSFETS of said first and second types.

2. A digital offset, non-overlapped, dual-output amplifier circuit comprising:
a first power supply input line;
a second power supply input line;
an amplifier input line;
a predriver stage connected to said first and second power supply input lines and to said amplifier input line,
  wherein said predriver stage further comprises an offset dual-output driver comprising:
    a MOSFET of a first type having:
      a first lead connected to said first power supply input line;
      a second lead;
      a gate connected to said amplifier input line;
    a MOSFET of a second type having:
      a first lead connected to said second power supply input line;
      a second lead coupled to said second lead of said MOSFET of said first type;
      a gate connected to said amplifier input line;
    a first voltage divider connected between said second leads of said MOSFETS of said first and second types;
    a second voltage divider connected between said second leads of said MOSFETS of said first and second types;
    a first predriver output line connected to a tap of said first voltage divider; and
    a second predriver output line connected to a tap of said second voltage divider; and
an output stage coupled to said predriver stage to receive an output signal of said predriver stage, and having:
  a first output terminal of said output stage;
  a second output terminal of said output stage;
    wherein in a quiescent state, a first output signal on said first output terminal has a first level; and a second output signal on said second output terminal has a second level wherein said second level is offset from said first level;
    said first and second output signals swing to a third level different from said first and second levels, in response to said output signal of said predriver stage, but reach said third level at different points in time so that said first and second output signals are offset and non-overlapping for a period of time during said swing; and
  said digital offset, non-overlapped, dual-output amplifier circuit is self-biasing and offset-nulling.

3. A digital offset, non-overlapped, dual-output amplifier circuit as in claim 2 wherein said output stage further comprises a quasi-class A push-pull driver.

4. A digital offset, non-overlapped, dual-output amplifier circuit as in claim 3 wherein said quasi-class-A push-pull driver further comprises an offset dual-output driver.

5. A digital offset, non-overlapped, dual-output amplifier circuit comprising:
a first power supply input line;
a second power supply input line;
an amplifier input line;
a predriver stage connected to said first and second power supply input lines and to said amplifier input line; and
an output stage coupled to said predriver stage to receive an output signal of said predriver stage, and having:
  a first output terminal of said output stage;
  a second output terminal of said output stage
    wherein said output stage comprises a quasi-class A push-pull driver further comprising an offset dual-output driver comprising:
      a MOSFET of a first type having:
        a first lead connected to said first power supply input line;
        a second lead;
        a gate connected to an output line of said predriver stage;

a MOSFET of a second type having:
  a first lead connected to said second power supply input line;
  a second lead coupled to said second lead of said MOSFET of said first type;
  a gate connected to said output line of said predriver stage;
a variable resistance element having a first lead connected to said second lead of said MOSFET of said first type; and a second lead connected to said second lead of said MOSFET of said second type;
a first output line connected to the second lead of said MOSFET of said first type, and to said first output terminal of said output stage; and
a second output line connected to the second lead of said MOSFET of said second type, and to said second output terminal of said output stage wherein in a quiescent state, a first output signal on said first output terminal has a first level; and a second output signal on said second output terminal has a second level wherein said second level is offset from said first level;

said first and second output signals swing to a third level different from said first and second levels, in response to said output signal of said predriver stage, but reach said third level at different points in time so that said first and second output signals are offset and non-overlapping for a period of time during said swing; and said digital offset, non-overlapped, dual-output amplifier circuit is self-biasing and offset-nulling.

* * * * *